(12) United States Patent
Moriya et al.

(10) Patent No.: US 11,164,589 B2
(45) Date of Patent: Nov. 2, 2021

(54) PERIODIC-COMBINED-ENVELOPE-SEQUENCE GENERATING DEVICE, ENCODER, PERIODIC-COMBINED-ENVELOPE-SEQUENCE GENERATING METHOD, CODING METHOD, AND RECORDING MEDIUM

(71) Applicant: Nippon Telegraph and Telephone Corporation, Chiyoda-ku (JP)

(72) Inventors: Takehiro Moriya, Atsugi (JP); Yutaka Kamamoto, Atsugi (JP); Noboru Harada, Atsugi (JP)

(73) Assignee: Nippon Telegraph and Telephone Corporation, Chiyoda-ku (JP)

( * ) Notice: Subject to any disclaimer, the term of this patent is extended or adjusted under 35 U.S.C. 154(b) by 0 days.

(21) Appl. No.: 16/788,539

(22) Filed: Feb. 12, 2020

(65) Prior Publication Data

US 2020/0202876 A1 Jun. 25, 2020

Related U.S. Application Data

(63) Continuation of application No. 16/199,370, filed on Nov. 26, 2018, now Pat. No. 10,607,616, which is a (Continued)

(30) Foreign Application Priority Data

May 1, 2014 (JP) ................................. 2014-094881

(51) Int. Cl.
*G10L 19/04* (2013.01)
*G10L 25/90* (2013.01)
*G10L 19/02* (2013.01)
*G10L 19/06* (2013.01)
*H03M 7/40* (2006.01)
*G10L 19/12* (2013.01)

(52) U.S. Cl.
CPC .............. *G10L 19/02* (2013.01); *G10L 19/04* (2013.01); *G10L 19/06* (2013.01); *G10L 19/12* (2013.01); *G10L 25/90* (2013.01); *H03M 7/40* (2013.01)

(58) Field of Classification Search
CPC ............................... G10L 19/04; G10L 25/90
See application file for complete search history.

(56) References Cited

U.S. PATENT DOCUMENTS 5,617,507 A 4/1997 Lee
5,809,456 A 9/1998 Cucchi
(Continued)

OTHER PUBLICATIONS

International Search Report dated May 12, 2015 in PCT/JP2015/054717, filed Feb. 20, 2015.
(Continued)

*Primary Examiner* — Bryan S Blankenagel
(74) *Attorney, Agent, or Firm* — Oblon, McClelland, Maier & Neustadt, L.L.P.

(57) ABSTRACT

An encoder and a decoder are provided that are capable of reproducing a frequency-domain envelope sequence that provides high approximation accuracy around peaks caused by the pitch period of an audio signal by using a small amount of code. An encoder of the present invention comprises a periodic-combined-envelope generating part and a variable-length coding part. The periodic-combined-envelope generating part generates a periodic combined envelope sequence which is a frequency-domain sequence based on a spectral envelope sequence which is a frequency-domain sequence corresponding to a linear predictive coefficient code obtained from an input audio signal and on a frequency-domain period. The variable-length coding part encodes a frequency-domain sequence derived from the input audio signal. A decoder of the present invention comprises a periodic-combined-envelope generating part
(Continued)

and a variable-length decoding part. The periodic-combined-envelope generating part generates a periodic combined envelope sequence which is a frequency-domain sequence based on a spectral envelope sequence which is a frequency-domain sequence corresponding to a linear predictive coefficient code and on a frequency-domain period. The variable-length decoding part decodes a variable-length code to obtain a frequency-domain sequence.

12 Claims, 12 Drawing Sheets

Related U.S. Application Data continuation of application No. 15/304,733, filed as application No. PCT/JP2015/054717 on Feb. 20, 2015, now Pat. No. 10,199,046.

(56) References Cited

U.S. PATENT DOCUMENTS

| | | | |
|---|---|---|---|
| 5,933,803 A | 8/1999 | Ojala | |
| 6,377,915 B1 | 4/2002 | Sasaki | |
| 6,885,986 B1 | 4/2005 | Gigi | |
| 2001/0003553 A1* | 6/2001 | Sako | H04N 21/23892 386/252 |
| 2008/0052065 A1 | 2/2008 | Kapoor | |
| 2008/0133223 A1* | 6/2008 | Son | G10L 19/0204 704/200.1 |
| 2009/0240491 A1 | 9/2009 | Reznik | |
| 2010/0318350 A1 | 12/2010 | Endo | |
| 2011/0029304 A1 | 2/2011 | Chen | |
| 2013/0311192 A1 | 11/2013 | Moriya | |
| 2013/0317814 A1 | 11/2013 | Moriya | |
| 2014/0156267 A1 | 6/2014 | Gao | |
| 2015/0187366 A1 | 7/2015 | Moriya | |

OTHER PUBLICATIONS

Anthony Vetro, "MPEG Unified Speech and Audio Coding", Industry and Standards, IEEE MultiMedia, Apr.-Jun. 2013, 10 pages.

Korean Office Action dated Aug. 29, 2017 in Patent Application No. 10-2016-7029792 (w/English translation).

Suat Yeldener, et al., "A Mixed Sinusoidally Excited Linear Prediction Coder at 4 kb/s and Below" Proceedings of the 1998 IEEE International Conference on Acoustics, Speech and Signal Processing, 1998. pp. 589-592.

* cited by examiner

PERIODIC-COMBINED-ENVELOPE-SEQUENCE GENERATING DEVICE, ENCODER, PERIODIC-COMBINED-ENVELOPE-SEQUENCE GENERATING METHOD, CODING METHOD, AND RECORDING MEDIUM

CROSS-REFERENCE TO RELATED APPLICATIONS

This application is a continuation of and claims the benefit of priority under 35 U.S.C. § 120 from U.S. application Ser. No. 16/199,370 filed Nov. 26, 2018, which is a continuation of U.S. application Ser. No. 15/304,733 filed Oct. 17, 2016 (now U.S. Pat. No. 10,199,046 issued Feb. 5, 2019), the entire contents of which are incorporated herein by reference. U.S. application Ser. No. 15/304,733 is a National Stage of PCT/JP2015/054717 filed Feb. 20, 2015, and claims the benefit of priority under 35 U.S.C. § 119 from Japanese Application No. 2014-094881 filed May 1, 2014.

TECHNICAL FIELD

The present invention relates to an encoder, a decoder, a coding method, a decoding method, a coding program, a decoding program and a recording medium for encoding and decoding audio signals using spectral envelops of the audio signals.

BACKGROUND ART

Among known coding methods for low-bit-rate (for example on the order of between 10 kbit/s to 20 kbit/s) speech and audio signals is adaptive coding for orthogonal transform coefficients, such as discrete Fourier transform (DFT) and modified discrete cosine transform (MDCT). In transform coded excitation (TCX) coding used in Non-Patent Literature 1, for example, the influence of amplitude spectral envelopes is eliminated from a coefficient string X[1], ..., X[N], which is a frequency-domain representation of an input sound signal, to obtain a sequence (a normalized coefficient string $X_N[1], \ldots, X_N[N]$), which is then encoded by variable length coding. Here, N in the brackets is a positive integer.

Amplitude spectral envelopes can be calculated as follows. (Step 1) Linear prediction analysis of an input audio digital signal in the time domain (hereinafter referred to as an input audio signal) is performed in each frame, which is a predetermined time segment, to obtain linear predictive coefficients $\alpha_1, \ldots, \alpha_P$, where P is a positive integer representing a prediction order. For example, according to a P-order autoregressive process, which is an all-pole model, an input audio signal x(t) at a time point t is expressed by Formula (1) with past values x(t−1), ..., x(t−P) of the signal itself at the past P time points, a prediction residual e(t) and linear predictive coefficients $\alpha_1, \ldots, \alpha_P$.

$$x(t) = \alpha_1 x(t-1) + \ldots + \alpha_P x(t-P) + e(t) \quad (1)$$

(Step 2) The linear predictive coefficients $\alpha_1, \ldots, \alpha_P$ are quantized to obtain quantized linear predictive coefficients $\hat{\alpha}_1, \ldots, \hat{\alpha}_P$. The quantized linear predictive coefficients $\hat{\alpha}_1, \ldots, \hat{\alpha}_P$ are used to obtain an amplitude spectral envelope sequence W[1], ..., W[N] of the input audio signal at N points. For example, each value W[n] of the amplitude spectral envelope sequence can be obtained in accordance with Formula (2), where n is an integer, 1≤n≤N, exp(·) is an exponential function with a base of Napier's constant, j is an imaginary unit, and σ is an amplitude of prediction residual signal.

$$W[n] = \sqrt{\frac{\sigma^2}{2\pi} \frac{1}{\left|1 + \sum_{p=1}^{P} \hat{\alpha}_p \exp(-j2\pi np/N)\right|^2}} \quad (2)$$

Note that a superscript written to the right-hand side of a symbol without brackets represents exponentiation. Specifically, $\sigma^2$ represents σ squared. While symbols such as "~" and "^" used in the description are normally to be written above a character that follows each of the symbols, the symbol is written immediately before the character because of notational constraints. In formulas, these symbols are written in their proper positions, i.e. above characters.

PRIOR ART LITERATURE

Non-Patent Literature

Non-Patent Literature 1: Anthony Vetro, "MPEG Unified Speech and Audio Coding", Industry and Standards, IEEE MultiMedia, April-June, 2013.

SUMMARY OF THE INVENTION

Problems to be Solved by the Invention

In order to allow the decoding side in audio signal codec to obtain information concerning a spectral envelope, a code corresponding to the spectral envelope needs to be transmitted to the decoding side. If a spectral envelope is obtained using linear predictive coefficients as in Non-Patent Literature 1, the "code corresponding to the spectral envelope" to be transmitted to the decoding side is a "code corresponding to linear predictive coefficients", which has the advantage of requiring only a small code amount. On the other hand, information concerning a spectral envelope obtained using linear predictive coefficients can have low approximation accuracy around peaks caused by the pitch period of the input audio signal, which can lead to a low coding efficiency of variable-length coding of normalized coefficient strings.

In light of the problem described above, the present invention provides an encoder and a decoder that are capable of reproducing a frequency-domain envelope sequence that provides high approximation accuracy around peaks caused by the pitch period of an audio signal by using a small amount of code.

Means to Solve the Problems

An encoder according to the present invention comprises a periodic-combined-envelope generating part and a variable-length coding part.

The periodic-combined-envelope generating part generates a periodic combined envelope sequence which is a frequency-domain sequence based on a spectral envelope sequence which is a frequency-domain sequence corresponding to a linear predictive coefficient code obtained from an input audio signal in a predetermined time segment and on a frequency-domain period corresponding to a period code obtained from the input audio signal. The variable-length coding part encodes a frequency-domain sequence derived from the input audio signal on the assumption that the amplitude of the input audio signal is greater for a frequency with a greater value of the periodic-combined envelope sequence. A decoder according to the present invention comprises a periodic-combined-envelope generating part and a variable-length decoding part. The periodic-combined-envelope generating part generates a periodic combined envelope sequence which is a frequency-domain sequence based on a spectral envelope sequence which is a frequency-domain sequence corresponding to a linear predictive coefficient code and on a frequency-domain period corresponding to a period code. The variable-length decoding part decodes a variable-length code to obtain a frequency-domain sequence on the assumption that the amplitude of an audio signal is greater for a frequency with a greater value of the periodic-combined envelope sequence.

Effects of the Invention

The encoder and the decoder according to the present invention achieve high efficiency of audio signal coding because the encoder and the decoder perform encoding and decoding, respectively, that use a small amount of code to reproduce a frequency-domain envelope sequence that provides high approximation accuracy around peaks caused by the pitch period of an input audio signal.

DETAILED DESCRIPTION OF THE EMBODIMENTS

Figure 1:
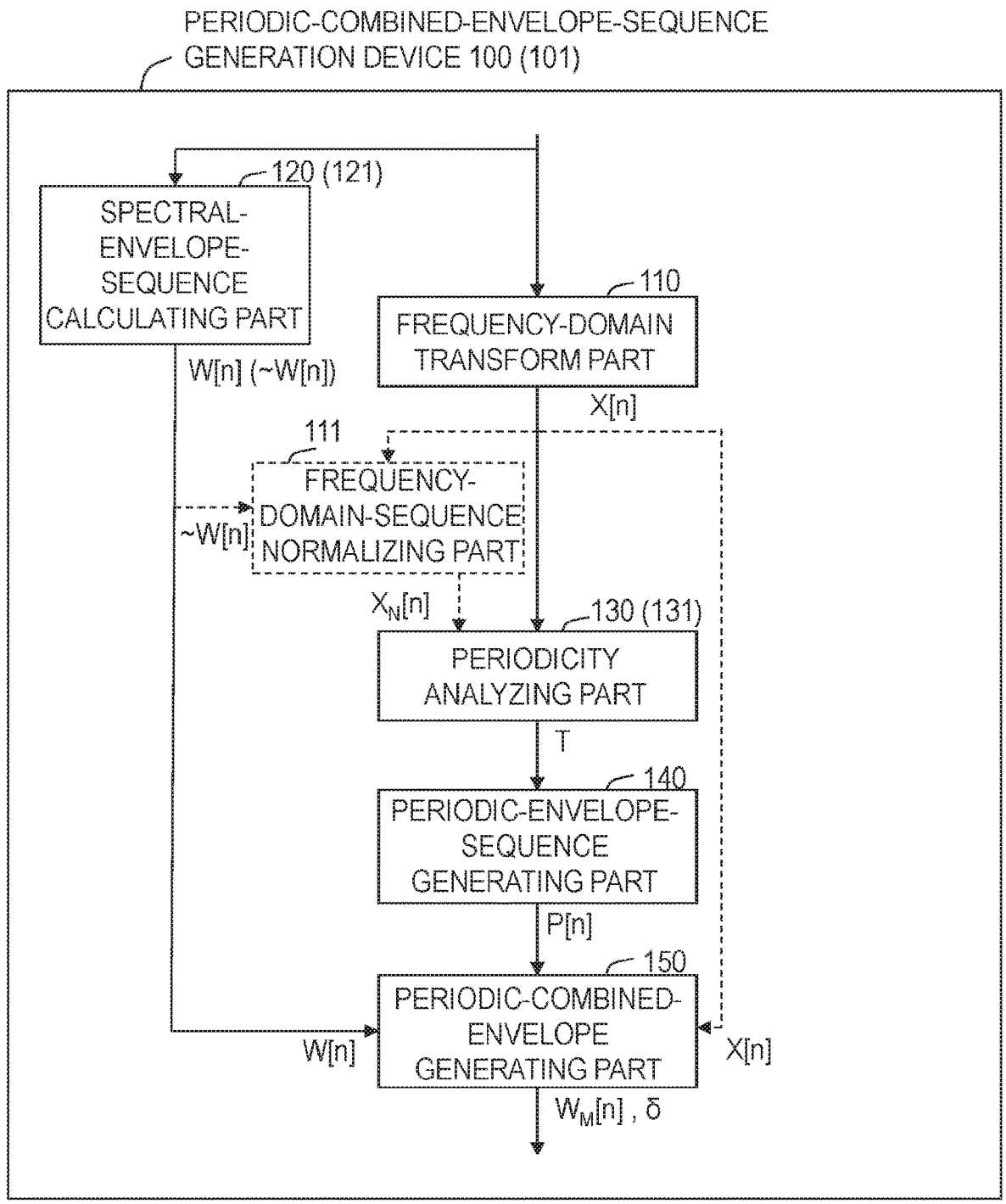
FIG. 1 is a diagram illustrating an exemplary functional configuration of a periodic-combined-envelope-sequence generation device according to a first embodiment.

Embodiments of the present invention will be described below in detail. Note that components that have the same functions are given the same reference numerals and repeated description thereof will be omitted.

First Embodiment

Figure 2:
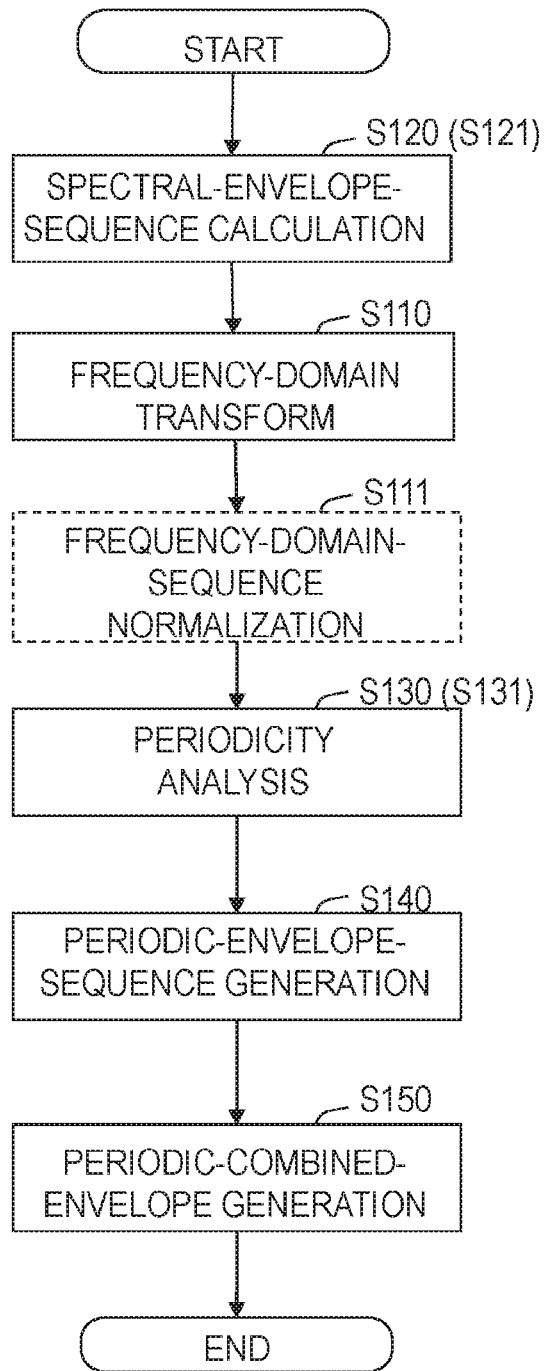
FIG. 2 is a diagram illustrating a process flow in the periodic-combined-envelope-sequence generation device according to the first embodiment.

FIG. 1 illustrates an exemplary functional configuration of a periodic-combined-envelope-sequence generation device according to the present invention and FIG. 2 illustrates a process flow in the periodic-combined-envelope-sequence generation device according to the present invention. The periodic-combined-envelope-sequence generation device 100 comprises a spectral-envelope-sequence calculating part 120, a frequency-domain transform part 110, a periodicity analyzing part 130, a periodic-envelope-sequence generating part 140, and a periodic-combined-envelope generating part 150, takes as an input audio signal x(t), an input time-domain audio digital signal, and transforms an amplitude spectral envelope sequence on the basis of a frequency component of a coefficient string to generate a periodic combined envelope sequence.

<Spectral-Envelope-Sequence Calculating part 120>

The spectral-envelope-sequence calculating part 120 calculates an amplitude spectral envelope sequence W[1], . . . , W[N] of an input audio signal x(t) on the basis of time-domain linear prediction of the input audio signal (S120). Here, N is a positive integer. The spectral-envelope-sequence calculating part 120 performs the calculation using the conventional technique as follows.

(Step 1) Linear prediction analysis of an input audio signal is performed in each frame, which is a predetermined time segment, to obtain linear predictive coefficients $\alpha_1, \ldots, \alpha_P$, where P is a positive integer representing a prediction order. For example, according to a P-order autoregressive process, which is an all-pole model, an input audio signal x(t) at a time point t is expressed by Formula (1) with past values x(t−1), . . . , x(t−P) of the signal itself at the past P time points, a prediction residual e(t) and linear predictive coefficients $\alpha_1, \ldots, \alpha_P$.

(Step 2) The linear predictive coefficients $\alpha_1, \ldots, \alpha_P$ are used to obtain an amplitude spectral envelope sequence W[1], . . . , W[N] of the input audio signal at N points. For example, each value W[n] of the amplitude spectral envelope sequence can be obtained using quantized linear predictive coefficients $\hat{\alpha}_1, \ldots, \hat{\alpha}_P$ that correspond to the linear predictive coefficients $\alpha_1, \ldots, \alpha_P$ in accordance with Formula (2). Alternatively, each value W[n] of the amplitude spectral envelope sequence can be obtained using the linear predictive coefficients $\alpha_1, \ldots, \alpha_P$ in accordance with Formula (2) in which $\hat{\alpha}_P$ is replaced with $\alpha_P$.

<Frequency-Domain Transform Part 110>

The frequency-domain transform part 110 transforms an input time-domain audio signal in each frame, which is a predetermined time segment, into a coefficient string $X[1], \ldots, X[N]$ at N points in the frequency domain and outputs the coefficient string $X[1], \ldots, X[N]$ (S110). Transform into the frequency domain may be performed by a method such as modified discrete cosine transform (MDCT) or discrete Fourier transform (DFT).

<Periodicity Analyzing Part 130>

The periodicity analyzing part 130 takes an input of a coefficient string $X[1], \ldots, X[N]$, obtains the period T of the coefficient string $X[1], \ldots, X[N]$, and outputs the period T (S130).

The period T is information corresponding to the interval between occurrences of a periodic component in the frequency-domain coefficient string derived from the input audio signal, for example the coefficient string $X[1], \ldots, X[N]$ (intervals at which a large value periodically appears). While the period T is hereinafter sometimes referred to as the interval T, they are different terms referring to the same concept. T is a positive value and may be an integer or a decimal fraction (for example, 5.0, 5.25, 5.5, 5.75).

The periodicity analyzing part 130 may take an input of a coefficient string $X[1], \ldots, X[N]$ and may also obtain and output an indicator S of the degree of periodicity. In that case, the indicator S of the degree of periodicity is obtained on the basis of the ratio between the energy of a periodic component part of the coefficient string $X[1], \ldots, X[N]$ and the energy of the other part of the coefficient string $X[1], \ldots, X[N]$, for example. The indicator S in this case indicates the degree of periodicity of a sample string in the frequency domain. Note that the greater the magnitude of the periodic component, i.e. the greater the amplitudes of samples at integer multiples of the period T and samples neighboring the samples (the absolute values of samples), the greater the "degree of periodicity" of the sample string in the frequency domain.

Note that the periodicity analyzing part 130 may obtain the period in the time domain from a time-domain input audio signal and may transform the obtained period in the time domain to a period in the frequency domain to obtain the period T. Alternatively, the periodicity analyzing part 130 may transform a period in the time domain to a period in the frequency domain and multiply the frequency-domain period by a constant to obtain the period T or may obtain a value near the frequency-domain period multiplied by the constant as the period T. Similarly, the periodicity analyzing part 130 may obtain the indicator S of the degree of periodicity from a time-domain input audio signal, for example, on the basis of the magnitude of correlation between signal strings temporally different from one another by a period in the time domain.

In short, any of various conventional methods may be chosen and used to obtain the period T and the indicator S from a time-domain input audio signal or a frequency-domain coefficient string derived from a time-domain input audio signal.

<Periodic-Envelope-Sequence Generating Part 140>

Figure 3:
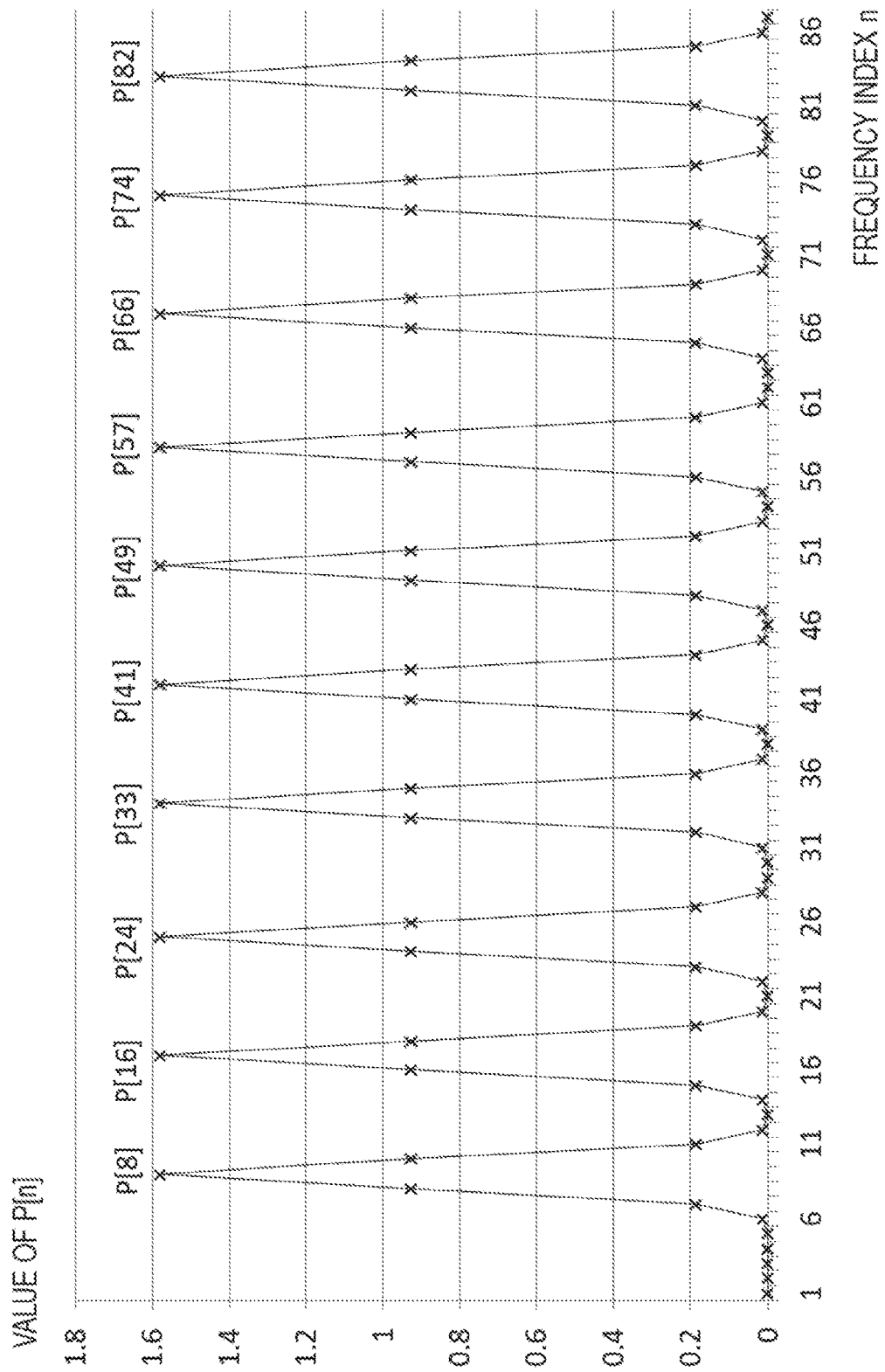
FIG. 3 is a diagram illustrating an example of a periodic envelope sequence P[1], . . . , P[N]

The periodic-envelope-sequence generating part 140 takes an input of the interval T and outputs a periodic envelope sequence $P[1], \ldots, P[N]$ (S140). The periodic envelope sequence $P[1], \ldots, P[N]$ is a frequency-domain discrete sequence that has peaks at periods resulting from a pitch period, that is, a discrete sequence corresponding to a harmonic model. FIG. 3 illustrates an example of periodic envelope sequence $P[1], \ldots, P[N]$. The periodic envelope sequence $P[1], \ldots, P[N]$ is a sequence in which only values of a periodic envelope corresponding to indices that are integer values neighboring integer multiples of the interval T and a predetermined number of preceding and succeeding the integer values are positive values and values of a periodic envelope corresponding to the other indices are 0 as in a waveform illustrated in FIG. 3. The indices that are integer values neighboring integer multiples of the interval T periodically take the maximum value (peak) and the values of P[n] corresponding to a predetermined number of indices preceding and succeeding the indices monotonically decrease with the increasing distance of the indices n from the indices corresponding to the peaks. 1, 2, . . . , on the horizontal axis in FIG. 3 represent indices of discrete sample points (hereinafter referred to as "frequency indices").

For example, let n denote a variable representing a frequency index and τ denote a frequency index corresponding to the maximum value (peak), then the shape of the peak can be represented by a function Q(n) given below. Here, the number of decimals of the interval T is L and an interval T' is $T'=T \times 2^L$.

$$Q(n) = h \cdot \exp\left(-\frac{(n-\tau)^2}{2PD}\right), \quad (3)$$

$$h = 2.8 \cdot (1.25 - \exp(-0.07 \cdot T'/2^L)),$$

$$PD = 0.5 \cdot (2.6 - \exp(-0.05 \cdot T'/2^L))$$

where h represents the height of the peak and the greater the interval T, the higher the peak. PD represents the width of the peak portion and the greater the interval T, the greater the width.

Let U denote a positive integer indicating a value from 1 to the number of peaks (for example, 1 to 10 in the case of FIG. 3), v denote an integer greater than or equal to 1 (for example, from 1 to 3 or so), floor (·) denote a function that drops the fractional part and returns an integer value, then the periodic envelope sequence P[n] may be calculated, for example, as $$P[n] = \left\{ h \cdot \exp\left(-\frac{(n - (\text{floor}((U \times T')/2^L) \pm v))^2}{2PD^2}\right) \right\} \quad (4)$$

Here, $(U \times T')/2^L - v \leq n \leq (U \times T')/2^L + v$. For example, in the case of L=2, =80 when T=20.00, =81 when T=20.25, =82 when T=20.50, and T'=83 when T=20.75. Note that the periodic envelope sequence P[n] may be calculated by using a function Round (·) that rounds off a value to the nearest integer and returns the integer value as $$P[n] = \left\{ h \cdot \exp\left(-\frac{(n - (\text{Round}(U \times T) \pm v))^2}{2PD^2}\right) \right\} \quad (5)$$

<Periodic-Combined-Envelope Generating Part 150>

The periodic-combined-envelope generating part 150 takes inputs of at least a periodic envelope sequence $P[1], \ldots, P[N]$ and an amplitude spectral envelope sequence $W[1], \ldots, W[N]$ and obtains a periodic combined envelope sequence $W_M[1], \ldots, W_M[N]$ (S150). Specifically, the periodic-combined-envelope generating part 150 obtains a periodic combined envelope $W_M[n]$ as following formula:

$$W_M[n] = W[n] \cdot (1 + \delta \cdot P[n]) \quad (6)$$

where δ is a value determined such that the shape of the periodic combined envelope $W_M[n]$ and the shape of a sequence of the absolute values of coefficients X[n] are similar to one another or δ is a predetermined value.

If the periodic-combined-envelope generating part 150 determines 6 such that the shape of the periodic combined envelope $W_M[n]$ and the shape of the sequence of the absolute values of coefficients X[n] are similar to one another, the periodic-combined-envelope generating part 150 may also take an input of a coefficient string X[1], ..., X[N] and may output the determined δ and the periodic combined envelope sequence $W_M[1]$, ..., $W_M[N]$ at that point in time. For example, δ that minimizes E defined by the formula given below may be chosen from among a number of candidates for δ, for example two candidates, 0.4 and 0.8. In other words, δ may be chosen such that the shape of the periodic combined envelope $W_M[n]$ and the shape of the sequence of the absolute values of coefficients X[n] become similar to one another.

$$E = \sum_{n=1}^{N} \left( X[n] \cdot \tilde{W}_M[n] \right)^4 \quad (7)$$

$$\tilde{W}_M[n] = \frac{1}{W_M[n] \cdot G} \quad (8)$$

$$G = \sum_{n=1}^{N} X[n] \cdot \frac{1}{W_M[n]} \quad (9)$$

δ is a value that determines the extent to which the periodic envelope P[n] is taken into account in the periodic combined envelope $W_M[n]$. In other words, δ is a value that determines the mixture ratio between the amplitude spectral envelope W[n] and the periodic envelope P[n] in the periodic combined envelope $W_M[n]$. G in Formula (9) is the inner product of the sequence of the absolute values of the coefficients X[n] in the coefficient string X[1], ..., X[N] and the reciprocal sequence of the periodic combined envelope sequence. $\tilde{W}_M[n]$ in Formula (8) is a normalized periodic combined envelope obtained by normalizing each value $W_M[n]$ in the periodic combined envelope with G. The inner product of the coefficient string X[1], ..., X[N] and the normalized periodic combined envelope sequence $\tilde{W}_M[1]$, ..., $\tilde{W}_M[N]$ is raised to the power of 4 in Formula (7) in order to emphatically reduce the inner product (distance) obtained by coefficients X[n] that have particularly large absolute values. This means that δ is determined such that coefficients X[n] that have particularly large absolute values in the coefficient string X[1], ..., X[N] and the periodic combined envelope $W_M[n]$ are similar to one another.

If the periodic-combined-envelope generating part 150 determines the number of candidates for δ in accordance with the degree of periodicity, the periodic-combined-envelope generating part 150 also takes an input of the indicator S of the degree of periodicity. If the indicator S indicates a frame that corresponds to high periodicity, the periodic-combined-envelope generating part 150 may choose δ that minimizes E defined by Formula (7) from among many candidates for δ; If the indicator S indicates a frame that corresponds to low periodicity, the periodic-combined-envelope generating part 150 may choose a predetermined value as δ. That is, if the periodic-combined-envelope generating part 150 determines the number of candidates for δ in accordance with the degree of periodicity, the periodic-combined-envelope generating part 150 may increase the number of candidates for δ with increasing degree of periodicity.

Effects of First Embodiment of the Invention

Figure 4A:
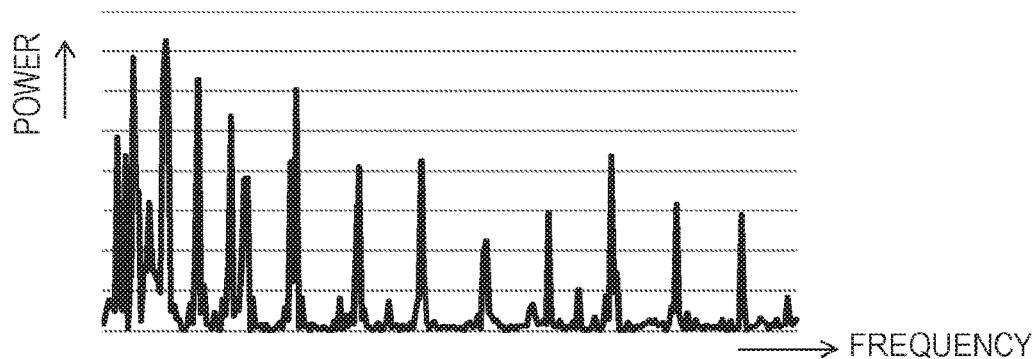
FIG. 4A is a diagram illustrating an example for explaining differences among sequences generated from the same audio signal and the shape of a curve produced by interpolating a coefficient string X[1], . . . , X[N]
Figure 4B:
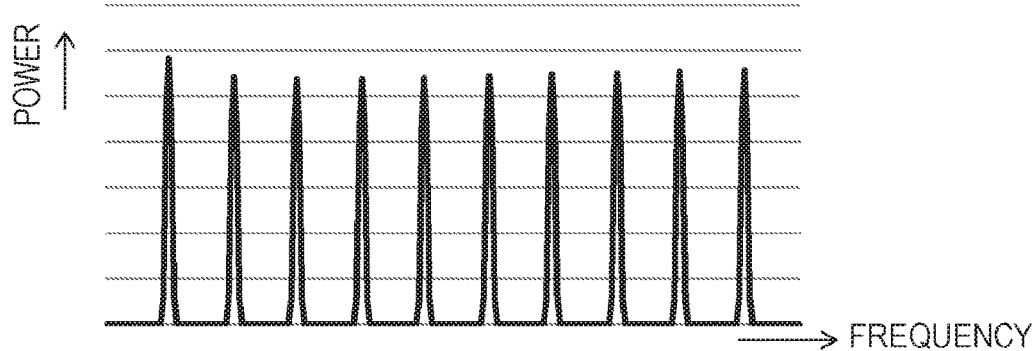
FIG. 4B is a diagram illustrating an example for explaining differences among sequences generated from the same audio signal and the shape of a curve produced by interpolating a periodic envelope sequence P[1], . . . , P[N]
Figure 4C:
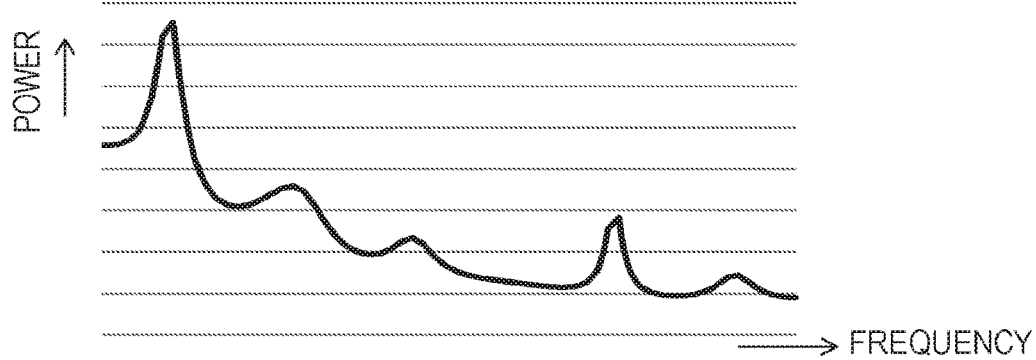
FIG. 4C is a diagram illustrating an example for explaining differences among sequences generated from the same audio signal and the shape of a curve produced by interpolating a smoothed amplitude spectral envelope sequence ~W[1], . . . , ~W[N]
Figure 4D:
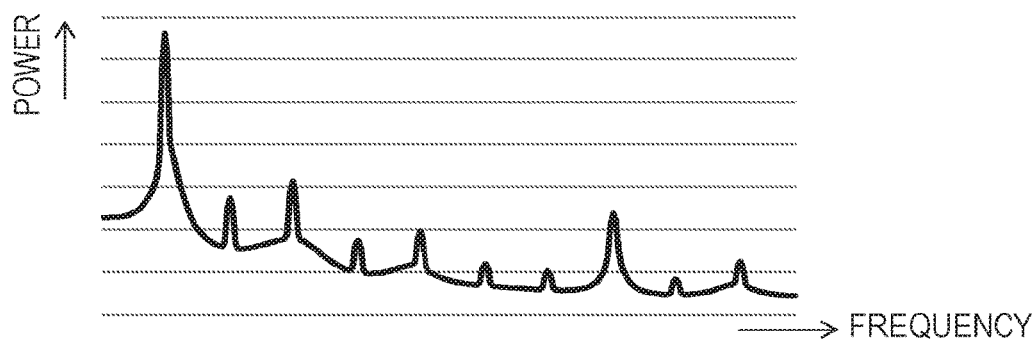
FIG. 4D is a diagram illustrating an example for explaining differences among sequences generated from the same audio signal and the shape of a curve produced by interpolating a periodic combined envelope sequence $W_M[1]$, . . . , $W_M[N]$.

FIGS. 4A-4D illustrate examples for explaining differences among sequences generated from the same audio signal. FIG. 4A illustrates the shape of a curve produced by interpolating a coefficient string X[1], ..., X[N], FIG. 4B illustrates the shape of a curve produced by interpolating a periodic envelope sequence P[1], ..., P[N], FIG. 4C illustrates the shape of a curve produced by interpolating a smoothed amplitude spectral envelope sequence $\tilde{W}[1]$, ..., $\tilde{W}[N]$, and FIG. 4D illustrates the shape of a curve produced by interpolating a periodic combined envelope sequence $W_M[1]$, ..., $W_M[N]$. As illustrated in FIG. 4, the periodic combined envelope sequence $W_M[1]$, ..., $W_M[N]$ has a shape comprising periodic peaks appearing in the coefficient string X[1], ..., X[N] as compared with the smoothed amplitude spectral envelope sequence $\tilde{W}[1]$, ..., $\tilde{W}[N]$. The periodic combined envelope sequence $W_M[1]$, ..., $W_M[N]$ can be generated using information about an interval T or an interval T and value of δ in addition to linear predictive coefficients or quantized linear predictive coefficients which are information representing a spectral envelope. Accordingly, peaks of amplitude caused by the pitch period of an input audio signal can be represented with a higher degree of accuracy simply by adding a small amount of information to information representing a spectral envelope of the input audio signal than by a spectral envelope obtained using linear predictive coefficients. In other words, the amplitude of the input audio signal can be estimated with a high degree of accuracy using a small amount of information made up of linear predictive coefficients or quantized linear predictive coefficients, and an interval T, or an interval T and value of δ. Note that the smoothed amplitude spectral envelope $\tilde{W}[n]$ is an envelope expressed by the following formula, where γ is a positive constant less than or equal to 1 for blunting (smoothing) amplitude spectral coefficients.

$$\tilde{W}[n] = \sqrt{\frac{\sigma^2}{2\pi} \frac{1}{\left|1 + \sum_{p=1}^{P} \hat{\alpha}_p \gamma^p \exp(-j2\pi np/N)\right|^2}} \quad (10)$$

If the periodic-combined-envelope-sequence generation device according to the present invention is used in an encoder and a decoder, codes (linear predictive coefficient codes $C_L$) for identifying quantized linear predictive coefficients $\hat{\alpha}_P$ obtained by a processing part other than the periodic-combined-envelope-sequence generation device included in the encoder and a code for identifying a period T or a time-domain period (a period code $C_T$) are input in the decoder. Therefore, by outputting a code indicating information concerning δ from the periodic-combined-envelope-sequence generation device of the present invention, the same periodic combined envelope sequence as a periodic combined envelope sequence generated by the periodic-combined-envelope-sequence generation device at the encoder side can also be generated by the periodic-combined-envelope-sequence generation device at the decoder side. Accordingly, an increase in the amount of code transmitted from the encoder to the decoder is small.

<Key Points of First Embodiment of the Invention>

The most important point of the periodic-combined-envelope-sequence generation device 100 according to the first embodiment is that the periodic-combined-envelope generating part 150 transforms an amplitude spectral envelope sequence W[1], ..., W[N] to a periodic combined envelope sequence $W_M[1]$, ..., $W_M[N]$ on the basis of a periodic component of a coefficient string X[1], ..., X[N]. In particular, the effect described above can be better achieved by more greatly changing the values of samples at integer multiples of the interval T (period) in the amplitude spectral envelope sequence W[1], ..., W[N] and samples in the neighborhood of the samples as the degree of periodicity of the coefficient string X[1], ..., X[N] is greater, that is, as the magnitude of a periodic component is greater. The "samples in the neighborhood" are samples indicated by indices which are integer values in the neighborhood of integer multiples of the interval T. "Neighborhood" means within a range determined using a predetermined method such as Formulas (3) to (5), for example.

Further, the greater the interval T between occurrences of a periodic component in the coefficient string X[1], ..., X[N], the greater the values of the periodic envelope sequence P[1], ..., P[N] shown in Formulas (4) and (5), and the greater range of samples, that is, the more samples at integer multiples of the interval T (period) and the more samples in the neighborhood of those samples have non-zero values. In other words, the periodic-combined-envelope generating part 150 more greatly changes the values of samples of integer multiples of the interval T (period) and samples in the neighborhood of those samples in the amplitude spectral envelope sequence as the length of the interval T between occurrences of a periodic component in the coefficient string is longer. Furthermore, as an interval T between occurrences of a periodic component in a coefficient string is longer, the periodic-combined-envelope generating part 150 changes the values of samples in a wider range in an amplitude spectral envelop sequence, i.e. the values of samples at integer multiples of the interval T (period) and a larger number of samples in the neighborhood of the samples at integer multiples of the interval T. The "more samples in the neighborhood" means that the number of samples in a range corresponding to the "neighborhood" (a range determined using a predetermined method) is increased. That is, the periodic-combined-envelope generating part 150 transform the amplitude spectral envelope sequence in this way to better achieve the effect described above.

Note that examples of effective uses of the characteristic of the periodic combined envelope sequence that "it can represent peaks of amplitude caused by the pitch period of an input audio signal with an improved degree of accuracy" include an encoder and a decoder, which will be illustrated in second and third embodiments. However, there may be examples of uses of the characteristic of the periodic combined envelope sequence other than an encoder and a decoder, such as a noise reduction device and a post-filter. The periodic-combined-envelope-sequence generation device has been thus described in the first embodiment.

[First Modification] (an Example in which Periodicity is Analyzed Using a Normalized Coefficient String)

FIG. 1 also illustrates a periodic-combined-envelope-sequence generation device according to a first modification. FIG. 2 also illustrates a process flow in the periodic-combined-envelope-sequence generation device according to the first modification. The periodic-combined-envelope-sequence generation device 101 is different from the periodic-combined-envelope-sequence generation device 100 in that the periodic-combined-envelope-sequence generation device 101 further comprises a frequency-domain-sequence normalizing part 111 and that the periodic-combined-envelope-sequence generation device 101 comprises a spectral-envelope-sequence calculating part 121 and a periodicity analyzing part 131 that are different from those of the periodic-combined-envelope-sequence generation device 100. The other components are the same as those of the periodic-combined-envelope-sequence generation device 100. Only differences will be described below.

<Spectral-Envelope-Sequence Calculating part 121>

The spectral-envelope-sequence calculating part 121 calculates a smoothed amplitude spectral envelope sequence ~W[1], ..., ~W[N] in addition to an amplitude spectral envelope sequence W[1], ..., W[N].

Specifically, the spectral-envelope-sequence calculating part 121 performs the following step in addition to (Step 1) and (Step 2) shown in the description of the spectral-envelope-sequence calculating part 120.

(Step 3) Each quantized linear predictive coefficient $\hat{\alpha}_p$ is multiplied by $\gamma^p$ to obtain quantized smoothed linear predictive coefficients $\hat{\alpha}_1\gamma, \hat{\alpha}_2\gamma^2, \ldots, \hat{\alpha}_P\gamma^P$. $\gamma$ is a positive constant less than or equal to 1 for smoothing. Then a smoothed amplitude spectral envelope sequence ~W[1], ..., ~W[N] is obtained in accordance with Formula (10) (S121). Like the spectral-envelope-sequence calculating part 120, the spectral-envelope-sequence calculating part 121 may use linear predictive coefficients $\alpha_p$ instead of the quantized linear predictive coefficients $\hat{\alpha}_p$, of course.

<Frequency-Domain-Sequence Normalizing Part 111>

The frequency-domain-sequence normalizing part 111 divides each coefficient in a coefficient string X[1], ..., X[N] by a coefficient in a smoothed amplitude spectral envelope sequence ~W[1], ..., ~W[N] to obtain a normalized coefficient string $X_N[1], \ldots, X_N[N]$. Specifically, for n=1, ..., N, $$X_N[n] = X[n]/\tilde{W}[n] \quad (11)$$

is calculated to obtain a normalized coefficient string $X_N[1], \ldots, X_N[N]$ (S111).

<Periodicity Analyzing Part 131>

The periodicity analyzing part 131 takes an input of the normalized coefficient string $X_N[1], \ldots, X_N[N]$ and obtains and outputs the period T of the normalized coefficient string $X_N[1], \ldots, X_N[N]$ (S131). That is, the interval between occurrences of a periodic component of a normalized coefficient string $X_N[1], \ldots, X_N[N]$, which is a frequency-domain coefficient string derived from the input audio signal, is obtained as the period T in this modification. The periodicity analyzing part 131 may also take an input of a coefficient string X[1], ..., X[N] and obtain and output an indicator S of the degree of periodicity.

The other processes are the same as in the periodic-combined-envelope-sequence generation device 100. Accordingly, the same effect as that of the first embodiment can be achieved. Note that the periodic-combined-envelope generating part 150 of the periodic-combined-envelope-sequence generation device 101 may use a smoothed amplitude spectral envelope sequence ~W[1], ..., ~W[N] instead of an amplitude spectral envelope sequence W[1], ..., W[N]. In this case, calculation is performed in accordance with the following formula instead of Formula (6).

$$W_M[n] = \tilde{W}[n] \cdot (1 + \delta \cdot P[n]) \quad (12)$$

[Second Modification] (an Example in which Information is Input from an External Source)

If a periodic-combined-envelope-sequence generation device according to the present invention is provided in each of an encoder and a decoder, processing parts comprised in the encoder and the decoder other than the periodic-combined-envelope sequence generation device may obtain a coefficient string X[1], . . . , X[N], a normalized coefficient string $X_N[1]$, $X_N[N]$, a quantized linear predictive coefficients $\hat{\alpha}_P$, quantized smoothed linear predictive coefficients $\hat{\alpha}_P \gamma^P$, an amplitude spectral envelope W[1], . . . , W[N], a smoothed amplitude spectral envelope sequence ~W[1], . . . , ~W[N], a period T, an indicator S or the like. In such a case, at least any of the frequency-domain transform part, the frequency-domain normalizing part, the spectral-envelope-sequence calculating part, and the periodicity analyzing part may be omitted from the periodic-combined-envelope-sequence generation device. In this case, a code identifying the quantized linear predictive coefficients $\hat{\alpha}_P$ (a linear predictive coefficient code $C_L$), a code identifying the period T or the time-domain period (a period code $C_T$), a code identifying the identifier S and the like are output from the processing parts other than the periodic-combined-envelope-sequence generation device in the encoder and input into the decoder. Accordingly, in this case, a code identifying the quantized linear predictive coefficients $\hat{\alpha}_P$ (the linear predictive coefficient code $C_L$), the code identifying the period T or the time-domain period (the period code $C_T$), the code identifying the indicator S and the like do not need to be output from the periodic-combined-envelope-sequence generation device in the encoder.

If a periodic-combined-envelope-sequence generation device according to the present invention is used in an encoder and a decoder, the encoder and the decoder need to be allowed to obtain the same periodic combined envelope sequence. Therefore, a periodic combined envelope sequence need to be obtained using information that can be identified by a code output from the encoder and input into the decoder. For example, a spectral-envelope-sequence calculating part of the periodic-combined-envelope-sequence generation device used in the encoder needs to use quantized linear predictive coefficients corresponding to a linear predictive coefficient code $C_L$ to obtain an amplitude spectral envelope sequence whereas a spectral-envelope-sequence calculating part of the periodic-combined-envelope-sequence generation device used in the decoder needs to use decoded linear predictive coefficients corresponding to the linear predictive coefficient code $C_L$ output from the encoder and input into the decoder to obtain the amplitude spectral envelope sequence.

Note that if an encoder and a decoder use periodic combined envelope sequences, required processing parts in the periodic-combined-envelope-sequence generation device may be provided in the encoder and the decoder, rather than providing the periodic-combined-envelope-sequence generation device inside the encoder and the decoder, as described above. Such encoder and decoder will be described in the description of a second embodiment.

Second Embodiment

<<Encoder>>

Figure 5:
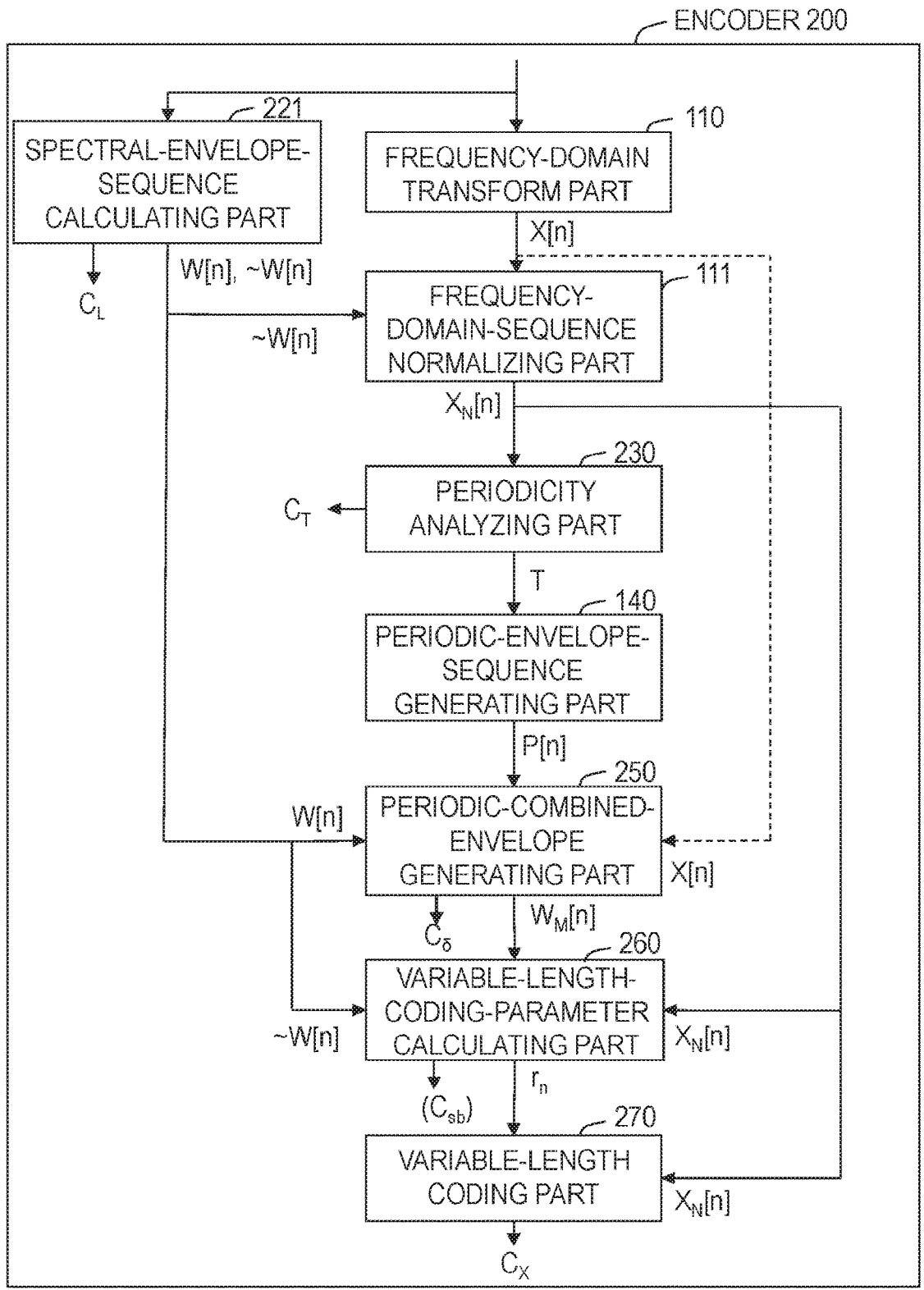
FIG. 5 is a diagram illustrating an exemplary functional configuration of an encoder according to a second embodiment.
Figure 6:
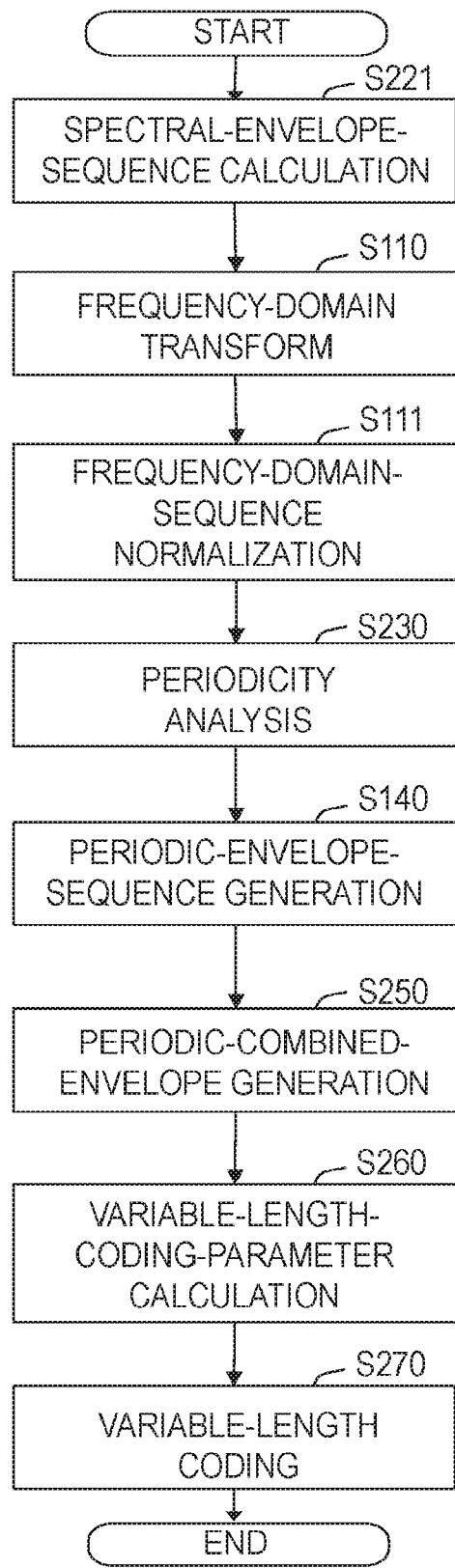
FIG. 6 is a diagram illustrating a process flow in the encoder according to the second embodiment.

FIG. 5 illustrates an exemplary functional configuration of an encoder according to the second embodiment and FIG. 6 illustrates a process flow in the encoder according to the second embodiment. The encoder 200 comprises a spectral-envelope-sequence calculating part 221, a frequency-domain transform part 110, a frequency-domain-sequence normalizing part 111, a periodicity analyzing part 230, a periodic-envelope-sequence generating part 140, a periodic-combined-envelope generating part 250, a variable-length-coding-parameter calculating part 260, and a variable-length coding part 270. The encoder 200 takes all input time-domain audio digital signal as an input audio signal x(t) and outputs at least a code $C_L$ representing quantized linear predictive coefficients $\hat{\alpha}_1, \ldots, \hat{\alpha}_P$, a code $C_T$ of an interval T representing the period of a normalized coefficient string $X_N[1], \ldots, X_N[N]$, and a variable-length code $C_X$ generated by variable-length coding of the nonnalized coefficient string $X_N[1], \ldots, X_N[N]$. The frequency-domain-sequence normalizing part 111 is similar to the frequency-domain-sequence normalizing parts 111 in the first modification of the first embodiment. The frequency-domain transform part 110 and the periodic-envelope-sequence generating part 140 are the same as that of the first embodiment. Components that differ from the components of the first embodiment and the first modification will be described below.

<Spectral-Envelope-Sequence Calculating Part 221>

The spectral-envelope-sequence calculating part 221 calculates an amplitude spectral envelope sequence W[1], . . . , W[N] and a smoothed amplitude spectral envelope sequence ~W[1], . . . , ~W[N] of an input audio signal x(t) on the basis of time-domain linear prediction of the input audio signal and also obtains a code $C_L$ representing quantized linear predictive coefficients $\hat{\alpha}_1, \ldots, \hat{\alpha}_P$ obtained in the process of the calculations (S221). Here, N is a positive integer. The spectral-envelope-sequence calculating part 221 may perform the following process.

(Step 1) Linear prediction analysis of the input audio signal in each frame, which is a predetermined time segment, is performed to obtain linear predictive coefficients $\alpha_1, \ldots, \alpha_P$, where P is a positive integer representing a prediction order. For example, according to a P-order autoregressive process, which is an all-pole model, an input audio signal x(t) at a time point t can be expressed by Formula (1) with past values x(t−1), . . . , x(t−P) of the signal itself at the past P time points, a prediction residual e(t) and linear predictive coefficients $\alpha_1, \ldots, \alpha_P$.

(Step 2) The linear predictive coefficients $\alpha_1, \ldots, \alpha_P$ are encoded to obtain and output a code $C_L$ and quantized linear predictive coefficients $\hat{\alpha}_1, \ldots, \hat{\alpha}_P$ that correspond to the code $C_L$ are obtained. The quantized linear predictive coefficients $\hat{\alpha}_1, \ldots, \hat{\alpha}_P$ are used to obtain an amplitude spectral envelope sequence W[1], . . . , W[N] of the input audio signal at N points. For example, each value W[n] of the amplitude spectral envelope sequence can be obtained in accordance with Formula (2). Note that any method for obtaining a code $C_L$ by encoding any coefficients that can be transformed to linear predictive coefficients may be used to encode the linear predictive coefficients $\alpha_1, \ldots, \alpha_P$ to obtain the code $C_L$, such as a method that transforms linear predictive coefficients to an LSP parameter and encodes the LSP parameter to obtain a code $C_L$.

(Step 3) Each quantized linear predictive coefficient $\hat{\alpha}_P$ is multiplied by $\gamma^P$ to obtain quantized smoothed linear predictive coefficients $\hat{\alpha}_1\gamma, \hat{\alpha}_2\gamma^2, \ldots, \hat{\alpha}_P\gamma^P$. $\gamma$ is a predetermined positive constant less than or equal to 1 for smoothing. Then a smoothed amplitude spectral envelope sequence ~W[1], . . . , ~W[N] is obtained in accordance with Formula (10).

<Periodicity Analyzing Part 230>

The periodicity analyzing part 230 takes an input of a normalized coefficient string $X_N[1], \ldots, X_N[N]$, obtains the interval T of the normalized coefficient string $X_N[1], \ldots, X_N[N]$ (the intervals at which a large value periodically appears) and outputs the interval T and a code $C_1$ representing the interval T (S230). The periodicity analyzing part 230 also obtains and outputs an indicator S of the degree of periodicity (i.e. an indicator of the degree of periodicity of a frequency-domain sample string) as needed. Additionally, the periodicity analyzing part 230 also obtains and outputs a code $C_S$ representing the indicator S as needed. Note that the indicator S and the interval T themselves are the same as the indicator S and the interval T, respectively, generated by the periodicity analyzing part 131 of the first modification of the first embodiment.

<Periodic-Combined-Envelope Generating Part 250>

The periodic-combined-envelope generating part 250 takes inputs of at least a periodic envelope sequence $P[1], \ldots, P[N]$ and an amplitude spectral envelope sequence $W[1], \ldots, W[N]$, obtains a periodic combined envelope sequence $W_M[1], \ldots, W_M[N]$ and outputs a periodic combined envelope $W_M[n]$. If the periodic-combined-envelope generating part 250 selects any of a predetermined number of candidate values as a value $\delta$ rather than a predetermined one value, the periodic-combined-envelope generating part 250 also takes an input of coefficient string $X[1], \ldots, X[N]$, chooses as the value $\delta$ a candidate value that makes the shape of a periodic combined envelope $W_M[n]$ and the shape of a sequence of the absolute values of coefficients $X[n]$ similar to one another among the predetermined number of candidate values and also outputs a code $C_\delta$ representing the value $\delta$ (S250).

The periodic combined envelope $W_M[n]$ and the value $\delta$ are the same as the periodic combined envelope $W_M[n]$ and the value $\delta$, respectively in the first embodiment. The periodic combined envelope $W_M[n]$ may be obtained in accordance with Formulas (6), . . . , (9). If the periodic-combined-envelope generating part 250 determines the number of candidates for $\delta$ in accordance with the degree of periodicity, the periodic-combined-envelope generating part 250 may also take an input of an indicator S of the degree of periodicity. When the indicator S of a frame is corresponding to high periodicity, the periodic-combined-envelope generating part 250 may choose $\delta$ that minimizes E defined by Formula (7) from among the large number of candidates for $\delta$; when the indicator S of a frame is corresponding to low periodicity, the periodic-combined-envelope generating part 250 may choose a predetermined value as $\delta$. Note that if $\delta$ is a predetermined value, a code $C_\delta$ that represents the value $\delta$ does not need to be output.

<Variable-Length-Coding-Parameter Calculating Part 260>

The variable-length-coding-parameter calculating part 260 takes inputs of a periodic combined envelope sequence $W_M[1], \ldots, W_M[N]$, a smoothed amplitude spectral envelope sequence $\tilde{W}[1], \ldots, \tilde{W}[N]$ and a normalized coefficient string $X_N[1], \ldots, X_N[N]$ and obtains a variable-length coding parameter $r_n$ (S260). The variable-length-coding-parameter calculating part 260 is characterized by calculating the variable-length coding parameter $r_n$ by relying on an amplitude value obtained from the periodic combined envelope sequence $W_M[1], \ldots, W_M[N]$.

The variable-length coding parameter identifies a range of values that the amplitudes of a signal to be encoded, that is, the amplitudes of coefficients in the normalized coefficient string $X_N P \ldots , X_N[N]$ can take. For example, a Rice parameter in Rice coding is equivalent to the variable-length coding parameter; in arithmetic coding, the range of values that the amplitude of the signal to be encoded can take is equivalent to the variable-length coding parameter.

If variable-length coding is performed for each sample, a variable-length coding parameter is calculated for each coefficient $X_N[n]$ in the normalized coefficient string. If variable-length coding is performed for each set of samples (for example each set of two samples), a variable-length coding parameter is calculated for each set of samples. In other words, the variable-length-coding-parameter calculating part 260 calculates the variable-length coding parameter $r_n$ for each normalized partial coefficient string that is a part of the normalized coefficient string. It is assumed here that there are a plurality of normalized partial coefficient strings and none of the coefficients of the normalized coefficient string overlap among the plurality of normalized partial coefficient strings. A method for calculating the variable-length coding parameter will be described below by taking an example where Rice coding is performed for each sample.

(Step 1) The logarithm of the average of the amplitudes of the coefficients in the normalized coefficient string $X_N[1], \ldots, X_N[N]$ is calculated as a reference Rice parameter sb (a reference variable-length coding parameter) as follows.

$$sb = \log_2\left\{(\ln 2) \cdot \frac{2\sum_{n=1}^{N}|X_N[n]|}{N}\right\} \quad (13)$$

sb is encoded only once per frame and is transmitted to a decoder 400 as a code $C_{sb}$ corresponding to the reference Rice parameter (the reference variable-length coding parameter). Alternatively, if the average value of the amplitudes of the normalized coefficient string $X_N[1], \ldots, X_N[N]$ can be estimated from additional information transmitted to the decoder 400, a method for approximating sb from the estimated average of the amplitudes that is common to the encoder 200 and the decoder 400 may be determined in advance. For example, in the case of coding in which a parameter representing the slope of an envelope and a parameter representing the magnitude of an average envelope for each sub-band are additionally used, the average of amplitudes can be estimated from additional information transmitted to the decoder 400. In that case, sb does not need to be encoded and a code $C_{sb}$ corresponding to the reference Rice parameter does not need to be output to the decoder 400.

(Step 2) A threshold $\theta$ is calculated in accordance with the following formula.

$$\theta = \log_2\left\{(\ln 2) \cdot \frac{2\sum_{n=1}^{N}|W_M[n]/\tilde{W}[n]|}{N}\right\} \quad (14)$$

$\theta$ is the logarithm of the average of amplitudes of values obtained by dividing each value $W_M[n]$ in the periodic-combined-envelope sequence by each value $\tilde{W}[n]$ in the smoothed amplitude spectral envelope sequence.

(Step 3) The greater $|W_M[n]/\tilde{W}[n]|$ is than $\theta$, the greater the value of the Rice parameter $r_n$ for Rice coding of the normalized coefficients $X_N[n]$ than sb is chosen. The smaller $|W_M[n]/\tilde{W}[n]|$ is than $\theta$, the smaller the value of the Rice parameter $r_n$ for Rice coding of the normalized coefficients $X_N[n]$ than sb is chosen.

(Step 4) Step 3 is repeated for all n=1, 2, . . . , N to obtain the value of the Rice parameter $r_n$ for each $X_N[n]$.

<Variable-Length Coding Part 270>

The variable-length coding part 270 encodes the normalized coefficient string $X_N[1], \ldots, X_N[N]$ by variable-length coding using the values of the variable-length coding parameter $r_n$ calculated by the variable-length-coding-parameter calculating part 260 and outputs a variable-length code $C_X$ (S270). For example, the variable-length coding part 270 encodes the normalized coefficient string $X_N[1], \ldots, X_N[N]$ by Rice coding using the Rice parameter $r_n$ obtained by the variable-length-coding-parameter calculating part 260 and outputs the obtained code as a variable-length code $C_X$. The values of the Rice parameter $r_n$ calculated by the variable-length-coding-parameter calculating part 260 are the values of the variable-length coding parameter that are dependent on the amplitude values of the periodic combined envelope sequence and greater values of the Rice parameter $r_n$ are obtained for frequencies with greater values of the periodic combined envelope sequence. Rice coding is one of well-known variable-length coding techniques that are dependent on amplitude values and uses the Rice parameter $r_n$ to perform variable-length coding that is dependent on amplitude values. The periodic combined envelope sequence generated by the periodic-combined-envelope generating part 250 represents a spectral envelope of the input audio signal with a high degree of accuracy. That is, the variable-length coding part 270 encodes the normalized coefficient string $X_N[1], \ldots, X_N[N]$ by variable-length coding on the assumption that the amplitude of the frequency-domain coefficient string $X[1], \ldots, X[N]$ of the input audio signal is greater for a frequency with a greater value of the periodic-combined envelope sequence, in other words, the variable-length coding part 270 encodes the normalized coefficient string $X_N[1], \ldots, X_N[N]$ by variable-length coding that depends on the amplitude value using the variable-length coding parameter. The amplitude value herein is a value such as the average amplitude value of the coefficient string to be encoded, an estimated amplitude value of each of the coefficients included in the coefficient string, or an estimated value of an envelope of the amplitude of the coefficient string.

The encoder 200 outputs the code $C_L$ representing the quantized linear prediction coefficients $\hat{\alpha}_1, \ldots, \hat{\alpha}_P$, the code $C_T$ representing the interval T, and the variable-length code $C_X$ generated by variable-length coding of the normalized coefficient string $X_N[1], \ldots, X_N[N]$ that have been obtained as a result of the process described above. The encoder 200 also outputs the code $C_\delta$ representing the value $\delta$ and the code $C_{sb}$ representing the reference variable-length coding parameter sb, if needed. The codes output from the encoder 200 are input into the decoder 400.

[First Modification of Encoder] (an Example in which Information is Input from an External Source)

Note that the encoder may comprise only the periodic-envelope-sequence generating part 140, the periodic-combined-envelope generating part 250, the variable-length-coding-parameter calculating part 260 and the variable-length coding part 270 and may take inputs of a smoothed amplitude spectral envelope sequence $\tilde{W}[1], \ldots, \tilde{W}[N]$, a normalized coefficient string $X_N[1], \ldots, X_N[N]$, an interval T and, if needed, an amplitude spectral envelope sequence $W[1], \ldots, W[N]$ and, if needed, the indicator S, that are generated externally to the encoder and may output a variable-length code $C_X$.

[Second Modification of Encoder] (an Example in which an Interval T is Obtained from a Coefficient String X[n])

While the periodicity analyzing part 230 described above takes an input of the normalized coefficient string $X_N[1], \ldots, X_N[N]$ to obtain the interval T, the periodicity analyzing part 230 may take an input of a coefficient string $X[1], \ldots, X[N]$ output from the frequency-domain transform part 110 to obtain the interval T. In this case, the interval T is obtained in the same way as in the periodicity analyzing part 130 of the first embodiment.

<<Decoder>>

Figure 7:
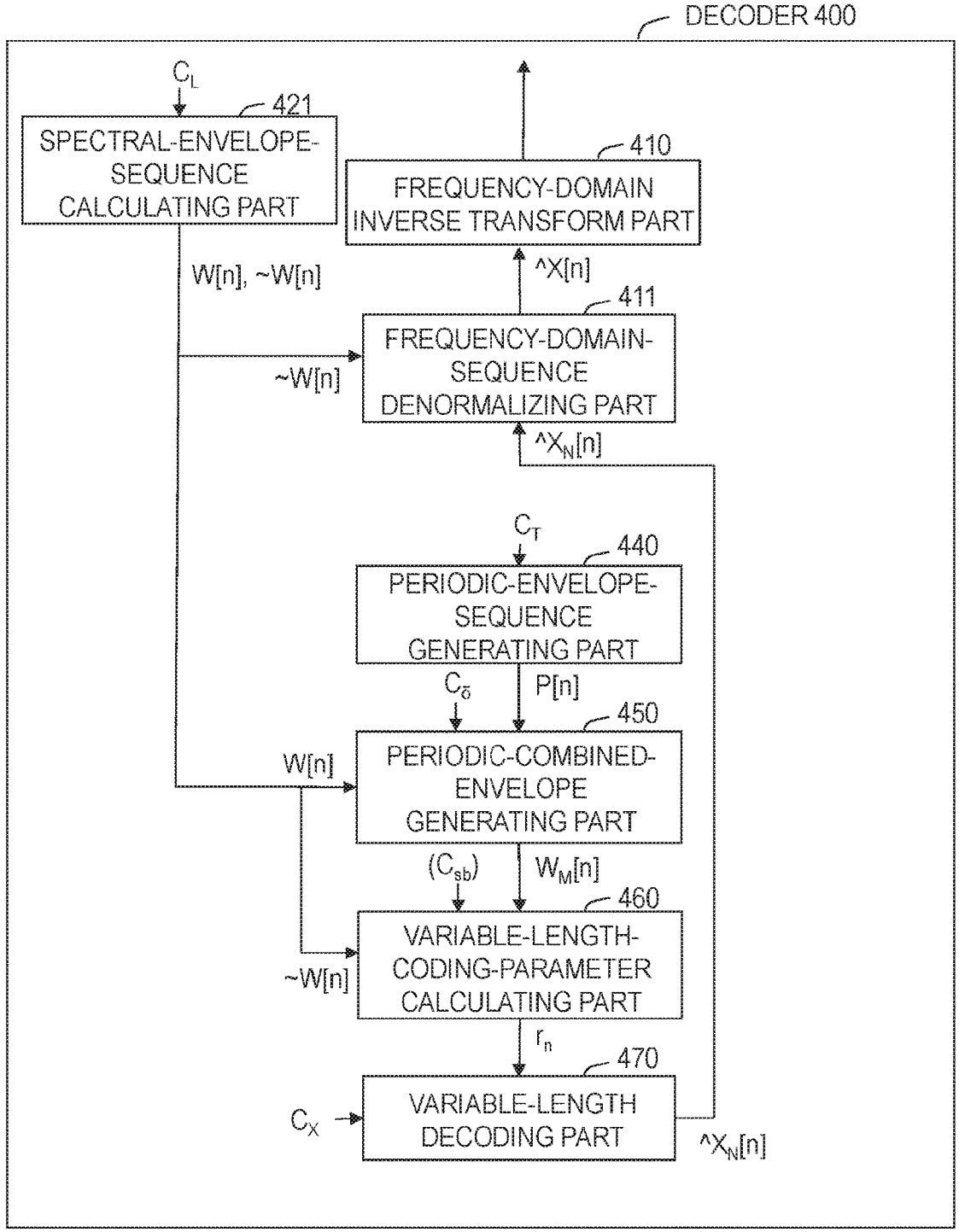
FIG. 7 is a diagram illustrating an exemplary functional configuration of a decoder according to the second embodiment.
Figure 8:
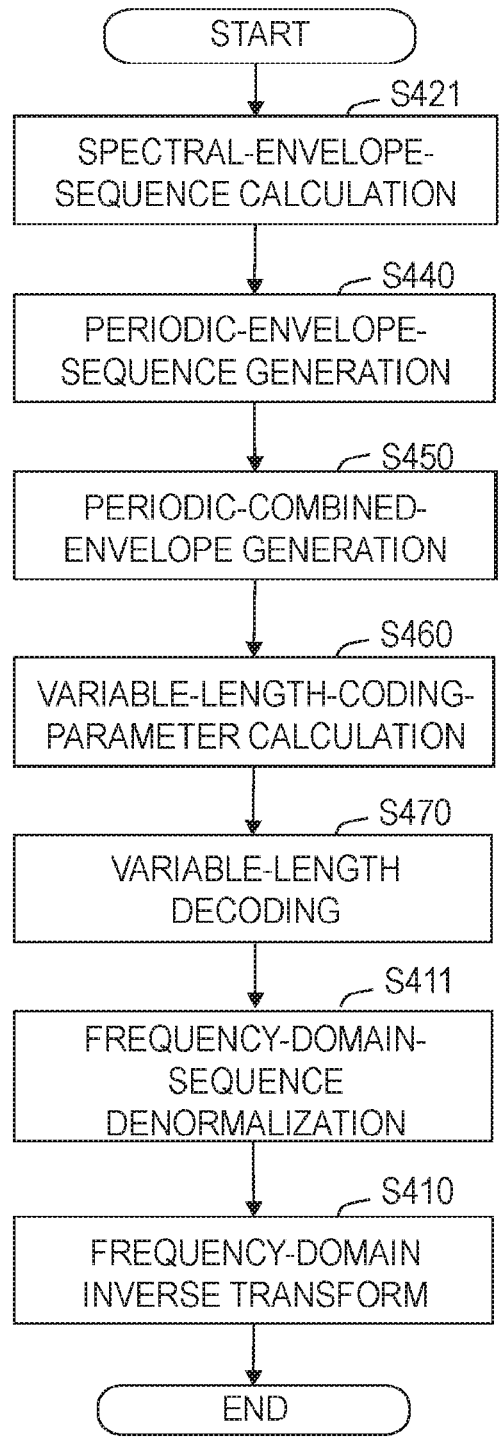
FIG. 8 is a diagram illustrating a process flow in the decoder according to the second embodiment.

FIG. 7 illustrates an exemplary functional configuration of a decoder according to the second embodiment and FIG. 8 illustrates a process flow in the decoder according to the second embodiment. The decoder 400 comprises a spectral-envelope-sequence calculating part 421, a periodic-envelope-sequence generating part 440, a periodic-combined-envelope generating part 450, a variable-length-coding-parameter calculating part 460, a variable-length decoding part 470, a frequency-domain-sequence denormalizing part 411, and a frequency-domain inverse transform part 410. The decoder 400 receives a code $C_L$ representing quantized linear predictive coefficients $\hat{\alpha}_1, \ldots, \hat{\alpha}_P$, a code $C_T$ representing an interval T, and a variable-length code $C_X$ generated by variable-length coding of a nonnalized coefficient string $X_N[1], \ldots, X_N[N]$ and outputs an audio signal. Note that the decoder 400 also receives a code $C_\delta$ representing a value $\delta$, a code $C_{sb}$ representing a reference variable-length coding parameter sb, and a code $C_S$ representing an indicator S, if needed. The components will be detailed below.

<Spectral-Envelope-Sequence Calculating Part 421>

The spectral-envelope-sequence calculating part 421 takes an input of a code $C_L$ and calculates an amplitude spectral envelope sequence $W[1], \ldots, W[N]$ and a smoothed amplitude spectral envelope sequence $\tilde{W}[1], \ldots, \tilde{W}[N]$ (S421). More specifically, the following process may be performed.

(Step 1) The code $C_L$ is decoded to obtain decoded linear predictive coefficients $\hat{\alpha}_1, \ldots, \hat{\alpha}_P$.

(Step 2) The decoded linear predictive coefficients $\hat{\alpha}_1, \ldots, \hat{\alpha}_P$ are used to obtain an amplitude spectral envelope sequence $W[1], \ldots, W[N]$ at N points. For example, each value W[n] in the amplitude spectral envelope sequence can be obtained in accordance with Formula (2).

(Step 3) Each of the decoded linear predictive coefficients $\hat{\alpha}_P$ is multiplied by $\gamma^P$ to obtain decoded smoothed linear predictive coefficients $\hat{\alpha}_1\gamma, \hat{\alpha}_2\gamma^2, \ldots, \hat{\alpha}_P\gamma^P$. Here, $\gamma$ is a predetermined positive constant less than or equal to 1 for smoothing. Then, a smoothed amplitude spectral envelope sequence $\tilde{W}[1], \ldots, \tilde{W}[N]$ is obtained in accordance with Formula (10).

<Periodic-Envelope-Sequence Generating Part 440>

The periodic-envelope-sequence generating part 440 takes an input of a code $C_T$ indicating an interval T and decodes the code $C_T$ to obtain the interval T. The periodic-envelope-sequence generating part 440 then obtains and outputs a periodic envelope sequence $P[1], \ldots, P[N]$ in the same way as the periodic-envelope-sequence generating part 140 of the encoder 200 does (S440).

<Periodic-Combined-Envelope Generating Part 450>

The periodic-combined-envelope generating part 450 takes inputs of a periodic envelope sequence P[1], ..., P[N], an amplitude spectral envelope sequence W[1], ..., W[N], and codes $C_\delta$ and $C_S$. However, the codes $C_\delta$ and $C_S$ are input optionally. The periodic-combined-envelope generating part 450 decodes the code $C_S$ to obtain a value δ. However, if the code $C_S$ is not input, code $C_\delta$ decoding is not performed but instead a value δ stored in the periodic-combined-envelope generating part 450 in advance is acquired. Note that if the code $C_S$ is input, the periodic-combined-envelope generating part 450 decodes the code $C_S$ to obtain the indicator S. If the obtained indicator S of a frame is corresponding to high degree of periodicity, the periodic-combined-envelope generating part 450 decodes the code $C_\delta$ to obtain a value δ; if the obtained indicator S of a frame is corresponding to low periodicity, the periodic-combined-envelope generating part 450 does not decode the code $C_\delta$ but instead acquires a value δ stored in advance in the periodic-combined-envelope generating part 450. The periodic-combined-envelope generating part 450 then obtains a periodic combined envelope sequence $W_M[1], ..., W_M[N]$ in accordance with Formula (6) (S450).

<Variable-Length-Coding-Parameter Calculating Part 460>

The variable-length-coding-parameter calculating part 460 takes inputs of a periodic combined envelope sequence $W_M[1], ..., W_M[N]$, a smoothed amplitude spectral envelope sequence $\tilde{W}[1], ..., \tilde{W}[N]$ and a code $C_{sb}$ to obtain a variable-length coding parameter $r_n$ (S460). However, if the average of amplitudes can be estimated from additional information transmitted to the decoder 400, a method for approximating sb from the average amplitude value estimated from the additional information may be determined in advance. In that case, the code $C_{sb}$ is not input. A method for calculating the variable-length coding parameter will be described below by taking an example where Rice decoding is performed for each sample.

(Step 1) The code $C_{sb}$ is decoded to obtain a reference Rice parameter sb (a reference variable-length coding parameter). If a method for approximating sb from an estimated value of the average of amplitudes that is common to the encoder 200 and the decoder 400 has been determined, the Rice parameter sb is calculated using the method.

(Step 2) A threshold θ is calculated in accordance with Formula (14).

(Step 3) The greater $|W_M[n]/\tilde{W}[n]|$ is than θ, the greater the value of the Rice parameter $r_n$ than sb is chosen in the same way as the variable-length-coding-parameter calculating part 260 of the encoder 200 does. The smaller $|W_M[n]/\tilde{W}[n]|$ is than θ, the smaller the value of the Rice parameter $r_n$ than sb is chosen in the same way as the variable-length-coding-parameter calculating part 260 of the encoder 200 does.

(Step 4) Step 3 is repeated for all n=1, 2, ..., N to obtain the value of the Rice parameter $r_n$ for each $X_N[n]$.

<Variable-Length Decoding Part 470>

The variable-length decoding part 470 decodes a variable-length code $C_X$ by using a variable-length coding parameter $r_n$ calculated by the variable-length-coding-parameter calculating part 460, thereby obtaining a decoded normalized coefficient string $\hat{X}_N[1], ..., \hat{X}_N[N]$ (S470). For example, the variable-length decoding part 470 decodes the variable-length code $C_X$ by using the Rice parameter $r_n$ calculated by the variable-length-coding-parameter calculating part 460, thereby obtaining the decoded normalized coefficient string $\hat{X}_N[1], ..., \hat{X}_N[N]$. The decoding method used by the variable-length decoding part 470 corresponds to the coding method used by the variable-length coding part 270.

<Frequency-Domain-Sequence Denormalizing Part 411>

The frequency-domain-sequence denormalizing part 411 takes inputs of a decoded normalized coefficient string $\hat{X}_N[1], ..., \hat{X}_N[N]$ and a smoothed amplitude spectral envelope sequence $\tilde{W}[1], ..., \tilde{W}[N]$ to obtain and outputs a decoded coefficient string $\hat{X}[1], ..., \hat{X}[N]$ as $$\hat{X}[n] = \hat{X}_N[n] \cdot \tilde{W}[n] \qquad (15)$$

(S411).

<Frequency-Domain Inverse Transform Part 410>

The frequency-domain inverse transform part 410 takes an input of a decoded coefficient string $\hat{X}[1], ..., \hat{X}[N]$ and transforms the decoded coefficient string $\hat{X}[1], ..., \hat{X}[N]$ to an audio signal (in the time domain) in each frame, which is a predetermined time segment (S410).

[First Modification of Decoder] (an Example in which Information is Input from an External Source)

A decoder may comprise the periodic-envelope-sequence generating part 440, the periodic-combined-envelope generating part 450, the variable-length-coding-parameter calculating part 460 and the variable-length decoding part 470 alone, may take inputs of a smoothed amplitude spectral envelope sequence $\tilde{W}[1], ..., \tilde{W}[N]$, an amplitude spectral envelope sequence W[1], ..., W[N] and an interval T and, if needed, an indicator S, that are obtained externally to the decoder, in addition to the codes $C_\delta$ and $C_{sb}$ which are input into the decoder if necessary, and may output a normalized coefficient string $X_N[1], ..., X_N[N]$, which may be multiplied by the smoothed amplitude spectral envelope sequence externally to the decoder to transform to a time-domain audio signal.

Effects of Second Embodiment of the Invention

Variable-length coding is a coding method that adaptively determines a code in accordance with the range of values of the amplitude of an input values to be encoded can take, thereby improving the efficiency of the coding. While a normalized coefficient string $X_N[1], ..., X_N[N]$, which is a coefficient string in the frequency domain, is encoded in the second embodiment, the efficiency of the variable-length coding itself performed by the encoder can be increased by using a variable-length coding parameter obtained more precisely using information concerning the amplitude of each coefficients included in a coefficient string to be encoded. However, in order for the decoder to obtain the variable-length coding parameter, the information concerning the amplitude of each coefficient included in the coefficient string to be encoded needs to be more precisely transmitted from the encoder to the decoder, resulting in an increase in the amount of code transmitted from the encoder to the decoder accordingly.

In order to reduce the increase in the amount of code, a method for obtaining an estimated value of the amplitude of each coefficient included in the coefficient string to be encoded from a code with a small code amount is necessary. Because a periodic combined envelope sequence $W_M[1], ..., W_M[N]$ in the second embodiment approximates a coefficient string X[1], ..., X[N] with a high degree of accuracy, $|W_M[1]/\tilde{W}[1]|, ..., |W_M[N]/\tilde{W}[N]|$ can approximate the amplitude envelope of $X_N[1], X_N[2], ..., X_N[N]$, which are coefficients to be encoded by variable-length coding, with a high degree of accuracy. In other words, $|W_M[1]/\char"02C6\relax W[1]|, \ldots, |W_M[N]/\char"02C6\relax W[N]|$ is a sequence in a positive correlation with the amplitude of the coefficients to be encoded.

Information required for recovering $|W_M[1]/\char"02C6\relax W[1]|$, $|W_M[2]/\char"02C6\relax W[2]|, \ldots, |W_M[N]/\char"02C6\relax W[N]|$ at the decoder side is Information representing quantized linear prediction coefficients $\hat{\alpha}_1, \ldots, \hat{\alpha}_P$ (code $C_L$)

Information indicating the interval T (code $C_T$)

Information indicating value δ (code $C_δ$).

That is, with the encoder and the decoder according to the second embodiment, the decoder can reproduce envelopes including peaks of amplitude caused by the pitch period of an input audio signal input in the encoder with a small amount of information, namely only codes $C_L$, $C_T$ and $C_δ$.

Note that the encoder and the decoder according to the second embodiment may be used in combination with an encoder and a decoder that perform coding/decoding that involve linear prediction or pitch prediction in many situations. In those situations, the codes $C_L$ and $C_T$ are transmitted from the encoder that is located external to the encoder 200 and performs coding that involves linear prediction or pitch prediction to the decoder that is located external to the decoder 400 and performs decoding involving linear prediction or pitch prediction. Accordingly, information that needs to be transmitted from the encoder 200 to the decoder 400 in order to allow the decoder side to recover envelopes comprising peaks of amplitude caused by the pitch period of an input audio signal input into the encoder side is codes $C_δ$. The code amount of each code $C_δ$ is small (each requires about 3 bits at most and even 1 bit of $C_6$ can be effective) and is smaller than the total amount of code corresponding to a variable-length coding parameter for each partial sequence included in a normalized coefficient string to be encoded.

The encoder and the decoder according to the second embodiment are thus capable of improving coding efficiency with a small increase in the amount of code.

<Key Points of Second Embodiment of the Invention>

Viewing the encoder and decoder according to the second embodiment from the point of achieving the effect described above, the encoder 200 may be characterized by comprising:

a periodic-combined-envelope generating part 250 which generates a periodic combined envelope sequence which is a frequency-domain sequence based on a spectral envelope sequence which is a frequency-domain sequence corresponding to a linear predictive coefficient code obtained from an input audio signal in a predetermined time segment and a frequency-domain period corresponding to a period code obtained from the input audio signal, and a variable-length coding part 270 which encodes a frequency-domain sequence derived from the input audio signal on the assumption that the amplitude of the input audio signal is greater for a frequency with a greater value of the periodic-combined envelope sequence, and the decoder 400 may be characterized by comprising:

a periodic-combined-envelope generating part 450 which generates a periodic combined envelope sequence which is a frequency-domain sequence based on a spectral envelope sequence which is a frequency-domain sequence corresponding to a linear predictive coefficient code and a frequency-domain period corresponding to a period code, and a variable-length decoding part 470 which decodes a variable-length code to obtain a frequency-domain sequence on the assumption that the amplitude of the audio signal is greater for a frequency with a greater value of the periodic-combined envelope sequence.

Note that "on the assumption that the amplitude of the input audio signal is greater for a frequency with a greater value of the periodic-combined envelope sequence" and "on the assumption that the amplitude of the audio signal is greater for a frequency with a greater value of the periodic-combined envelope sequence" represent that the periodic combined envelope sequence is characterized by taking a large value at a frequency with a large amplitude of the input audio signal or the audio signal. Further, "derived from the input audio signal" means that the frequency-domain sequence can be obtained from the input audio signal or corresponds to the input audio signal. For example, a coefficient string $X[1], \ldots, X[N]$ and a normalized coefficient string $X_N[1], \ldots, X_N[N]$ are frequency-domain sequences derived from the input audio signal.

Third Embodiment

<<Encoder>>

Figure 9:
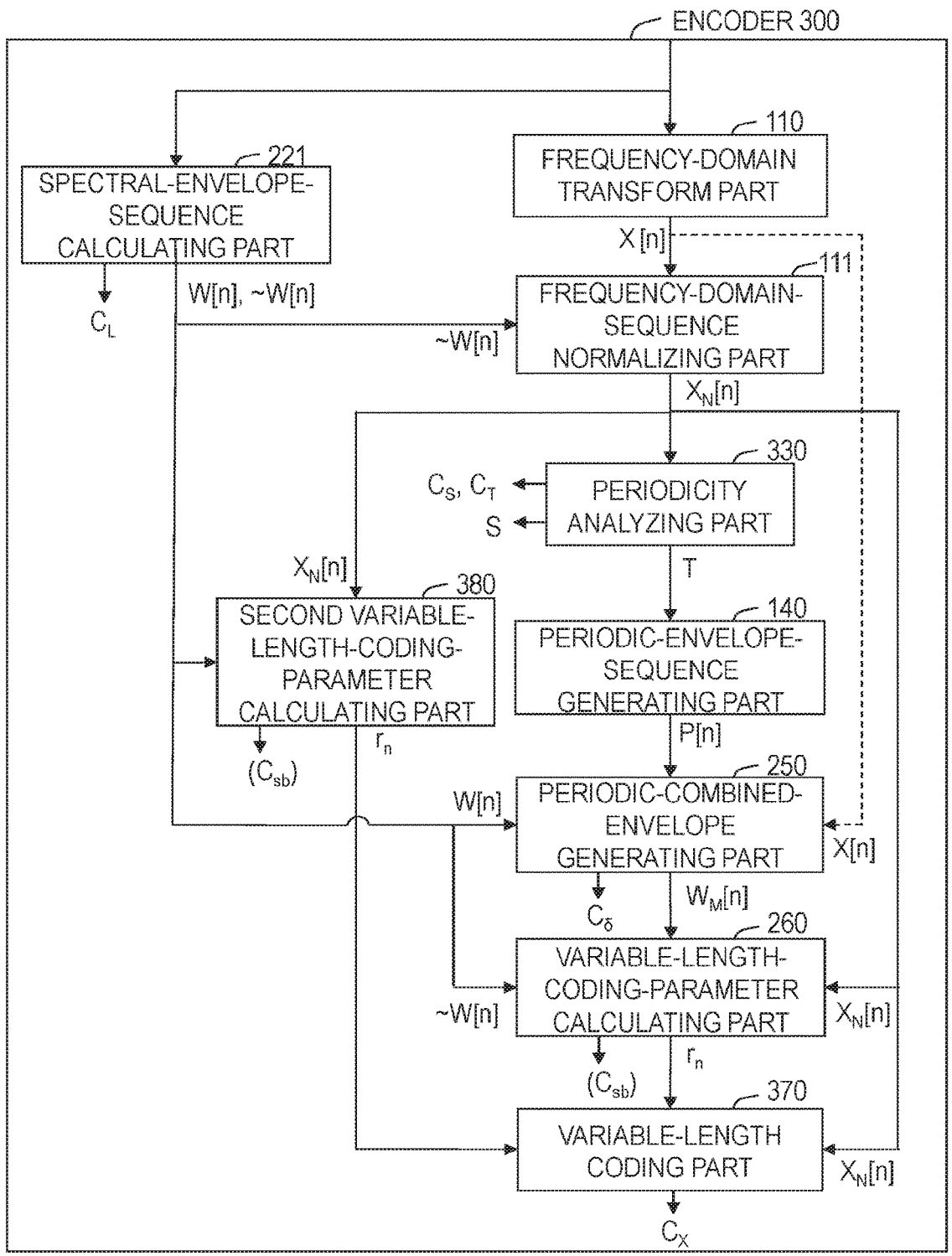
FIG. 9 is a diagram illustrating an exemplary functional configuration of an encoder according to a third embodiment.
Figure 10:
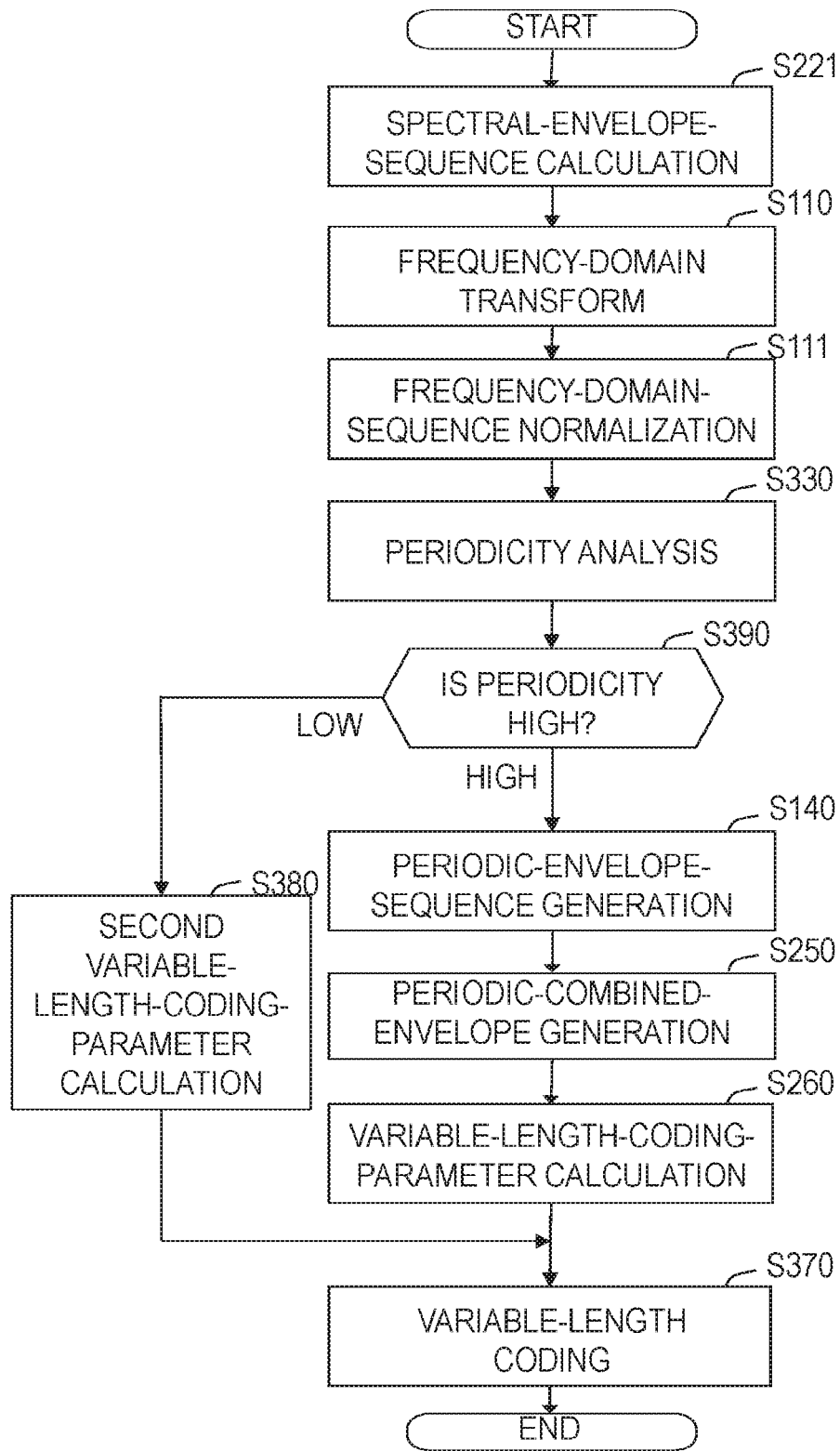
FIG. 10 is a diagram illustrating a process flow in the encoder according to the third embodiment.

FIG. 9 illustrates an exemplary functional configuration of an encoder according to a third embodiment and FIG. 10 illustrates a process flow in the encoder according to the third embodiment. The encoder 300 comprises a spectral-envelope-sequence calculating part 221, a frequency-domain transform part 110, a frequency-domain-sequence normalizing part 111, a periodicity analyzing part 330, a periodic-envelope-sequence generating part 140, a periodic-combined-envelope generating part 250, a variable-length-coding-parameter calculating part 260, a second variable-length-coding-parameter calculating part 380, and a variable-length coding part 370. The encoder 300 takes an input time-domain audio digital signal as an input audio signal x(t) and outputs at least a code $C_L$ representing quantized linear predictive coefficients $\hat{\alpha}_1, \ldots, \hat{\alpha}_P$, a code $C_T$ of an interval T representing the period of a normalized coefficient string $X_N[1], \ldots, X_N[N]$, a predetermined indicator S of the degree of periodicity of a coefficient string $X[1], \ldots, X[N]$ or the normalized coefficient string $X_N[1], \ldots, X_N[N]$, a code $C_S$ representing the indicator S, and a variable-length code $C_X$ generated by variable-length coding of the normalized coefficient string $X_N[1], \ldots, X_N[N]$. The frequency-domain-sequence normalizing part 111 is the same as the frequency-domain-sequence normalizing part 111 of the first modification of the first embodiment. The frequency-domain transform part 110 and the periodic-envelope-sequence generating part 140 are the same as the frequency-domain transform part 110 and the periodic-envelope-sequence generating part 140, respectively, of the first embodiment. The amplitude-spectral-envelope-sequence calculating part 221, the periodic-combined-envelope generating part 250 and the variable-length-coding-parameter calculating part 260 are the same as the amplitude-spectral-envelope-sequence calculating part 221, the periodic-combined-envelope generating part 250 and the variable-length-coding-parameter calculating part 260, respectively, of the second embodiment. Components that differ from the components of the embodiments and modifications described above will be described below.

<Periodicity Analyzing Part 330>

The periodicity analyzing part 330 takes an input of a normalized coefficient string $X_N[1], \ldots, X_N[N]$, obtains an indicator S of the degree of periodicity of the normalized coefficient string $X_N[1], \ldots, X_N[N]$ and an interval T (intervals at which a large value periodically appears) and outputs the indicator S, a code $C_S$ representing the indicator S, the interval T and a code $C_T$ representing the interval T (S330). Note that the indicator S and the interval T are the same as those output from the periodicity analyzing part 131 of the first modification of the first embodiment.

In the encoder 300, if the indicator S is within a predetermined range that indicates high periodicity, the variable-length-coding-parameter calculating part 260 calculates a variable-length coding parameter $r_n$; if the indicator S is not within the predetermined range indicating high periodicity, the second variable-length-coding-parameter calculating part 380 calculates a variable-length coding parameter $r_n$ (S390). The "predetermined range indicating high periodicity" may be a range of values of the indicator S that are greater than or equal to a predetermined threshold.

<Second Variable-Length-Coding-Parameter Calculating part 380>

The second variable-length-coding-parameter calculating part 380 takes inputs of an amplitude spectral envelope sequence W[1], . . . , W[N], a smoothed amplitude spectral envelope sequence ~W[1], . . . , ~W[N], and a normalized coefficient string $X_N[1], \ldots, X_N[N]$ and obtains a variable-length coding parameter $r_n$ (S380). While the variable-length-coding-parameter calculating part 260 is characterized by calculating a variable-length coding parameter $r_n$ by relying on an amplitude value obtained from a periodic combined envelope sequence $W_M[1], \ldots, W_M[N]$, the second variable-length-coding-parameter calculating part 380 is characterized by calculating a variable-length coding parameter by relying on an amplitude value obtained from an amplitude spectral envelope sequence. A method for calculating the variable-length coding parameter will be described below by taking an example where Rice coding is performed for each sample.

(Step 1) The logarithm of the average of the amplitudes of the coefficients in the normalized coefficient string $X_N[1], \ldots, X_N[N]$ is calculated as a reference Rice parameter sb (a reference variable-length coding parameter) as Formula (13). The step is the same as the step performed by the variable-length-coding-parameter calculating part 260.

(Step 2) A threshold θ is calculated according to the following Formula.

$$\theta = \log_2\left\{(\ln 2) \cdot \frac{2\sum_{n=1}^{N} |W[n]/\tilde{W}[n]|}{N}\right\} \quad (16)$$

θ is the logarithm of the average of amplitudes of values obtained by dividing each value $W_M[n]$ in the amplitude spectral envelope sequence by each value ~W[n] in the smoothed amplitude spectral envelope sequence.

(Step 3) The greater |WM[n]/~W[n]| is than θ, the greater the value of the Rice parameter $r_n$ for Rice coding of the normalized coefficients $X_N[n]$ than sb is chosen. The smaller |WM[n]/~W[n]| is than θ, the smaller the value of the Rice parameter $r_n$ for Rice coding of the normalized coefficients $X_N[n]$ than sb is chosen.

(Step 4) Step 3 is repeated for all n=1, 2, . . . , N to obtain the value of the Rice parameter $r_n$ for each $X_N[n]$.

<Variable-Length Coding Part 370>

The variable-length coding part 370 encodes the normalized coefficient string $X_N[1], \ldots, X_N[N]$ by variable-length coding using a variable-length coding parameter $r_n$ and outputs a variable-length code $C_X$ (S370). Note that if the indicator S is within the predetermined range indicating high periodicity, the variable-length coding parameter $r_n$ is a variable-length coding parameter $r_n$ calculated by the variable-length-coding-parameter calculating part 260; if the indicator S is not within the predetermined range indicating high periodicity, the variable-length coding parameter $r_n$, is a variable-length coding parameter $r_n$ calculated by the second variable-length-coding-parameter calculating part 380.

The encoder 300 outputs the code $C_L$ representing the quantized linear prediction coefficients $\hat{\alpha}_1, \ldots, \hat{\alpha}_P$, the code $C_S$ representing the indicator S of degree of periodicity, the code $C_T$ representing the interval T, and the variable-length code $C_X$ generated by variable-length coding of the normalized coefficient string $X_N[1], \ldots, X_N[N]$ which have been obtained as a result of the process described above and transmits them to the decoding side. The encoder 300 also outputs the code $C_\delta$ representing the value δ and the code $C_{sb}$ representing the reference variable-length coding parameter sb, if needed and transmits them to the decoding side.

[First Modification of Encoder] (an Example in which Information is Input from an External Source)

Note that the encoder may comprise only the periodic-envelope-sequence generating part 140, the periodic-combined-envelope generating part 250, the variable-length-coding-parameter calculating part 260, the second variable-length-coding-parameter calculating part 380, and the variable-length coding part 370 and may take inputs of a smoothed amplitude spectral envelope sequence ~W[1], . . . , ~W[N], a normalized coefficient string $X_N[1], \ldots, X_N[N]$, and an interval T and, if needed an amplitude spectral envelope sequence W[1], . . . , W[N] and if needed the indicator S that are generated externally to the encoder and may output a variable-length code $C_X$.

[Second Modification of Encoder] (an Example in which an Interval T is Obtained from a Coefficient String X[n])

While the periodicity analyzing part 330 described above takes an input of the normalized coefficient string $X_N[1], \ldots, X_N[N]$ to obtain the interval T, the periodicity analyzing part 330 may take an input of a coefficient string X[1], . . . , X[N] output from the frequency-domain transform part 110 to obtain the interval T. In this case, the interval T is obtained in the same way as the periodicity analyzing part 130 of the first embodiment does.

<<Decoder>>

Figure 11:
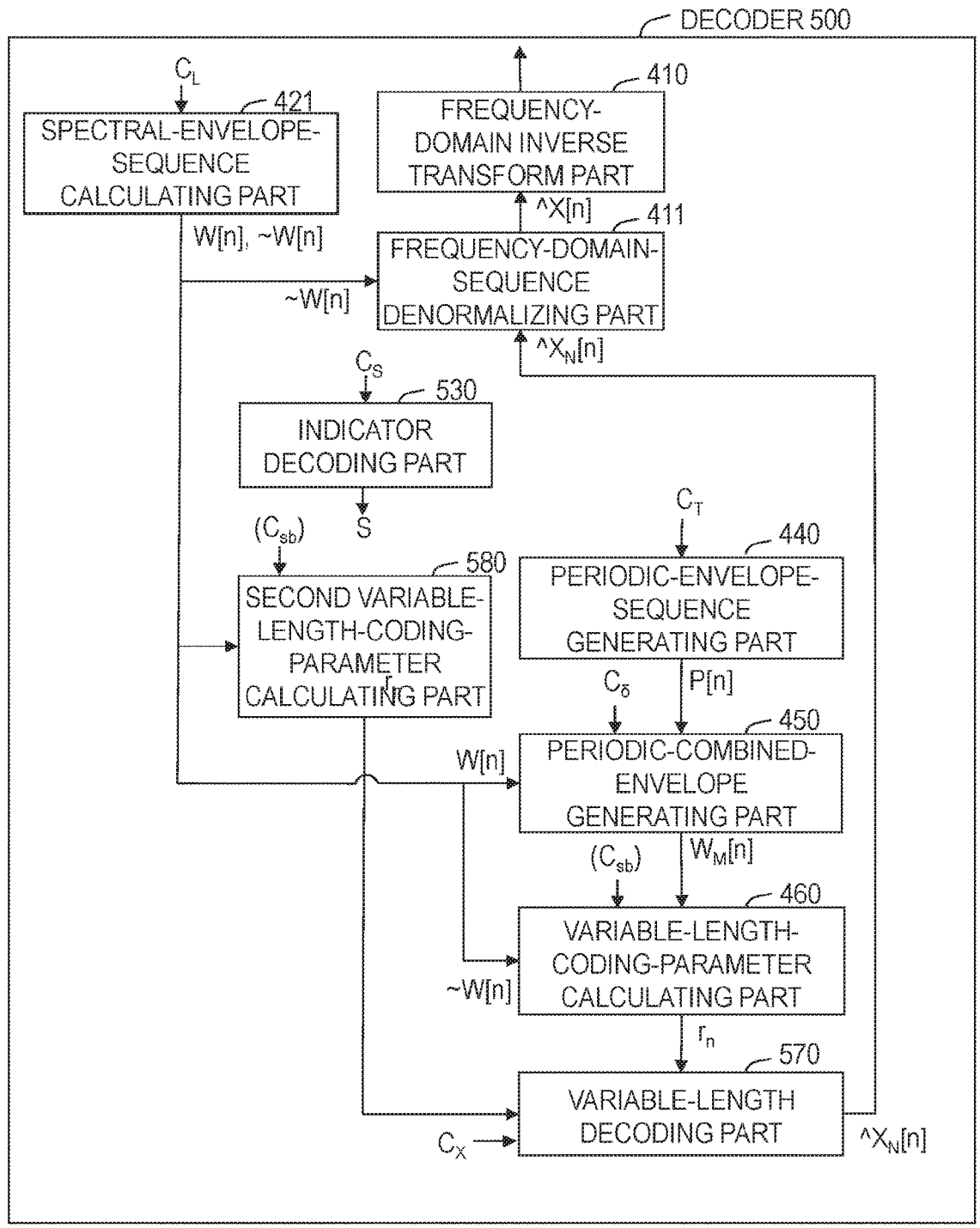
FIG. 11 is a diagram illustrating an exemplary functional configuration of a decoder according to the third embodiment.
Figure 12:
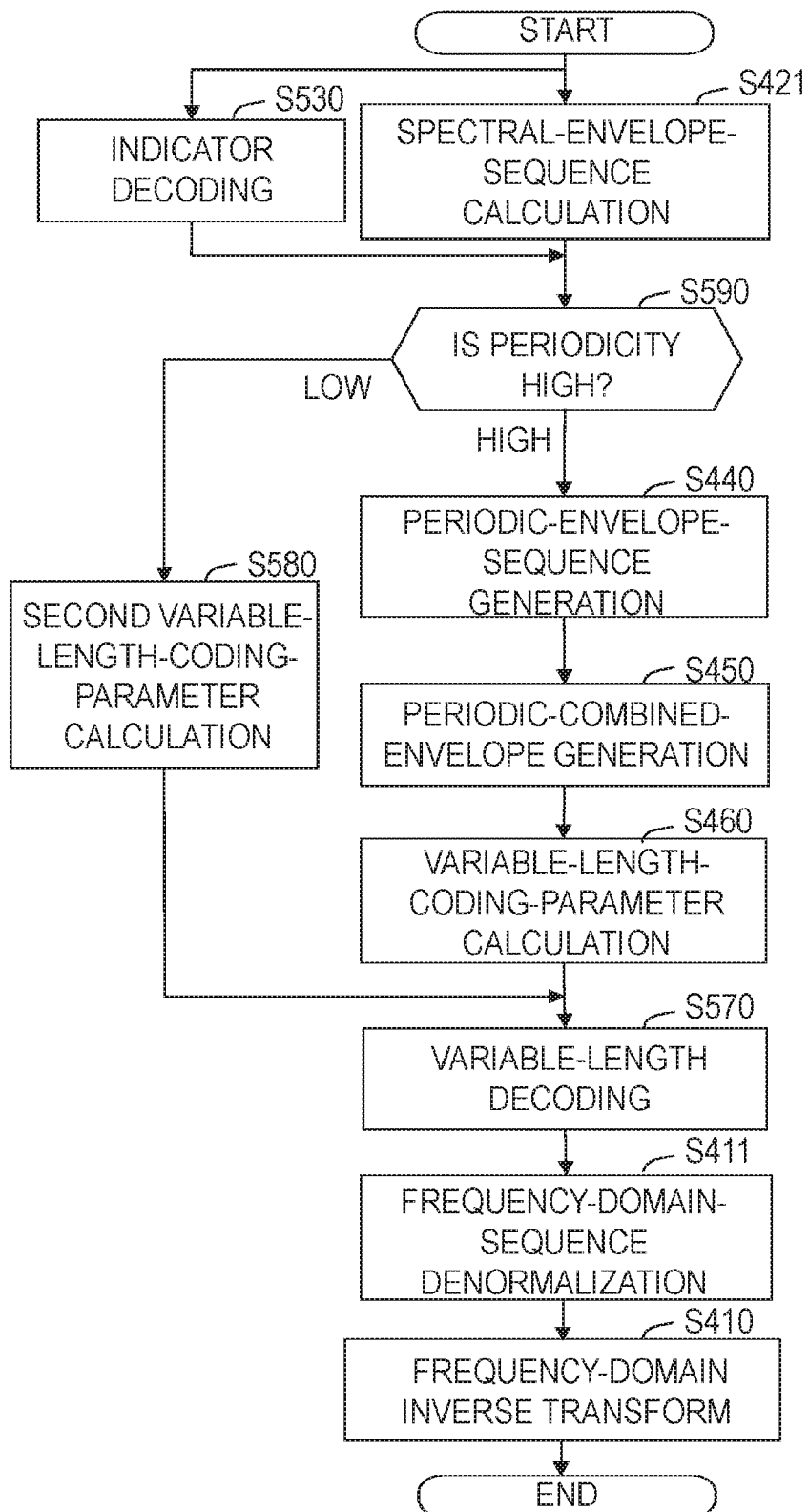
FIG. 12 is a diagram illustrating a process flow in the decoder according to the third embodiment.

FIG. 11 illustrates an exemplary functional configuration of a decoder according to the third embodiment and FIG. 12 illustrates a process flow in the decoder according to the third embodiment. The decoder 500 comprises a spectral-envelope-sequence calculating part 421, an indicator decoding part 530, a periodic-envelope-sequence generating part 440, a periodic-combined-envelope generating part 450, a variable-length-coding-parameter calculating part 460, a second variable-length-coding-parameter calculating part 580, a variable-length decoding part 570, a frequency-domain-sequence denormalizing part 411, and a frequency-domain inverse transform part 410. The decoder 500 receives a code $C_L$ representing quantized linear predictive coefficients $\hat{\alpha}_1, \ldots, \hat{\alpha}_P$, a code $C_S$ representing an indicator S, a code $C_T$ representing an interval T, and a variable-length code $C_X$ generated by variable-length coding of a normalized coefficient string $X_N[1], \ldots, X_N[N]$ and outputs an audio signal. Note that the decoder 500 also receives a code $C_δ$ representing a value δ, and a code $C_{sb}$ representing a reference variable-length coding parameter sb, as needed. The spectral-envelope-sequence calculating part 421, the periodic-envelope-sequence generating part 440, the periodic-combined-envelope generating part 450, the variable-length-coding-parameter calculating part 460, the frequency-domain-sequence denormalizing part 411, and a frequency-domain inverse transform part 410 are the same as those of the second embodiment. Components that differ from the components of the second embodiment will be described below.

<Indicator Decoding Part 530>

The indicator decoding part 530 decodes the code $C_S$ to obtain the indicator S. In the decoder 500, if the indicator S is within a predetermined range that indicates high periodicity, the variable-length-coding-parameter calculating part 460 calculates a variable-length coding parameter $r_n$; if the indicator S is not within the predetermined range that indicates high periodicity, the second variable-length-coding-parameter calculating part 580 calculates a variable-length coding parameter $r_n$ (S590). Note that the "predetermined range that indicates high periodicity" is the same range that is set in the encoder 300.

<Second Variable-Length-Coding-Parameter Calculating Part 580>

The second variable-length-coding-parameter calculating part 580 takes inputs of an amplitude spectral envelope sequence W[1], ..., W[N], a smoothed amplitude spectral envelope sequence ~W[1], ..., ~W[N], and a code $C_{sb}$ and obtains a variable-length coding parameter $r_n$ (S580). However, if the average of amplitudes can be estimated from additional information transmitted to the decoder 500, a method for approximating sb from the average of the amplitudes estimated from the additional information may be determined in advance. In that case, the code $C_{sb}$ is not input. A method for calculating the variable-length coding parameter will be described below by taking an example where Rice coding is performed for each sample.

(Step 1) The code $C_{sb}$ is decoded to obtain a reference Rice parameter sb (a reference variable-length coding parameter). If a method for approximating sb from an estimated value of amplitudes that is common to the encoder 300 and the decoder 500 has been determined, the Rice parameter sb is calculated using the method.

(Step 2) A threshold value θ is calculated in accordance with Formula (16).

(Step 3) The greater |WM[n]/~W[n]| is than θ, the greater the value of the Rice parameter $r_n$ than sb is chosen in the same way as the second variable-length-coding-parameter calculating part 380 of the encoder 300 does. The smaller |WM[n]/~W[n]| is than θ, the smaller the value of the Rice parameter $r_n$ than sb is chosen in the same way as the second variable-length-coding-parameter calculating part 380 of the encoder 300 does.

(Step 4) Step 3 is repeated for all n=1, 2, ..., N to obtain the Rice parameter $r_n$ for each $X_N[n]$.

<Variable-Length Decoding Part 570>

The variable-length decoding part 570 decodes a variable-length code $C_X$ by using the variable-length coding parameter $r_n$, thereby obtaining a decoded normalized coefficient string $\hat{X}_N[1], \ldots, \hat{X}_N[N]$ (S570). Note that if the indicator S is within the predetermined range indicating high periodicity, the variable-length coding parameter $r_n$ is a variable-length coding parameter $r_n$ calculated by the variable-length-coding-parameter calculating part 460; if the indicator S is not within the range indicating high periodicity, the variable-length coding parameter $r_n$ is a variable-length coding parameter $r_n$ calculated by the second variable-length-coding-parameter calculating part 580.

[First Modification of Decoder] (an Example in which Information is Input from an External Source)

A decoder may comprise the periodic-envelope-sequence generating part 440, the periodic-combined-envelope generating part 450, the variable-length-coding-parameter calculating part 460, a second variable-length-coding-parameter calculating part 580, and the variable-length decoding part 570 alone, may take inputs of a smoothed amplitude spectral envelope sequence ~W[1], ..., ~W[N], an amplitude spectral envelope sequence W[1], ..., W[N] and an interval T and, an indicator S, that are obtained externally to the decoder, in addition to the codes $C_δ$ and $C_{sb}$ which are input into the decoder if needed, and may output a normalized coefficient string $X_N P 1, \ldots, X_N[NT]$, which may then be multiplied by a smoothed amplitude spectral envelope sequence externally to the decoder to transform it to a time-domain audio signal.

Effects of the Third Embodiment of the Invention

If the degree of periodicity of an input audio signal is low, peaks of amplitude caused by the pitch period of the input audio signal is small. Therefore, when the degree of periodicity of an audio signal to be encoded is high, the encoder and decoder according to the third embodiment use a periodic combined envelope sequence to obtain a variable-length coding parameter; when the degree of periodicity of the audio signal to be encoded is not high, the encoder and the decoder use an amplitude spectral envelope sequence to obtain a variable-length coding parameter. Accordingly, a more appropriate variable-length coding parameter can be used for variable-length coding, which has the effect of improving the coding accuracy.

The first to third embodiments have been described with examples in which amplitude sequences such as an amplitude spectral envelope sequence, a smoothed amplitude spectral envelope sequence, and a periodic combined envelope sequence are used. However, instead of amplitude sequences, power sequences, namely a power spectral envelope sequence, a smoothed power spectral envelope sequence, a periodic combined envelope sequence that is a power sequence may be used as W[n], ~W[n], and $W_M[n]$.

[Program and Recording Media]

The processes described above may be performed not only in time sequence as is written but also in parallel or individually, depending on the throughput of the devices that perform the processes or requirements. It would be understood that modifications can be made as appropriate without departing from the spirit of the present invention.

If the configurations described above is implemented by a computer, processing of the function that each device needs to include is described in a program. The program is executed on the computer to implement the processing functions described above on the computer.

The program describing the processing can be recorded on a computer-readable recording medium. The computer-readable recording medium may be any medium such as a magnetic recording device, an optical disc, a magneto-optical recording medium, and a semiconductor memory, for example.

The program may be distributed, for example, by selling, transferring, or lending portable recording media on which the program is recorded, such as DVDs or CD-ROMs. The program may be stored on a storage device of a server computer and transferred from the server computer to other computers over a network, thereby distributing the program.

A computer that executes the program first stores the program recorded on a portable recording medium or the program transferred from a server computer into a storage device of the computer, for example. When the computer executes the processes, the computer reads the program stored in the recording medium of the computer and executes the processes according to the read program. In another mode of execution of the program, the computer may read the program directly from a portable recording medium and may execute the processes according to the program or may further execute the processes according to the program each time the program is transferred from the server computer to the computer. Alternatively, the processes described above may be executed using a so-called ASP (Application Service Provider) service in which the program is not transferred from a server computer to the computer but processing functions are implemented only by instructions to execute the program and acquisition of the results of the execution. It should be noted that the program in this mode includes information that is made available for use in processing by an electronic computer and is equivalent to a program (such as data that is not direct commands to the computer but has the nature of defining processing performed by the computer).

While a given program is executed on a computer to configure the present device in this mode, at least part of the processes may be implemented by hardware.

DESCRIPTION OF REFERENCE NUMERALS 100, 101 Periodic-combined-envelope-sequence generation device
110 Frequency-domain transform part
111 Frequency-domain-sequence normalizing part
120, 121, 221, 421 Spectral envelope sequence calculating part
130, 131, 230, 330 Periodicity analyzing part
140, 440 Periodic-envelope-sequence generating part
150, 250, 450 Periodic-combined-envelope generating part
200, 300 Encoder
260, 360, 460 Variable-length-coding-parameter calculating part
270, 370 Variable-length coding part
380, 580 Second variable-length-coding-parameter calculating part
400, 500 Decoder
410 Frequency-domain inverse transform part
411 Frequency-domain-sequence denormalizing part
470, 570 Variable-length decoding part
530 Indicator decoding part

What is claimed is:

1. An encoder comprising:
circuitry configured to:
execute a spectral-envelope-sequence calculating processing in which the circuitry calculates a spectral envelope sequence, $W[1], \ldots, W[N]$, of an input audio signal on the basis of linear prediction of the input audio signal which is a time-domain audio signal in a predetermined time segment;
execute a periodic-combined-envelope generating processing in which the circuitry generates a periodic combined envelope sequence, $W_M[1], \ldots, W_M[N]$, by changing the spectral envelope sequence, $W[1], \ldots, W[N]$, on the basis of a periodic envelope sequence $P[1], \ldots, P[N]$ which is a periodic component of the input audio signal in the frequency domain, wherein the spectral envelope sequence are changed as in the following formula:

$$W_M[n] = W[n] \cdot (1 + \delta \cdot P[n]),$$

wherein $\delta$ is a predetermined value or a chosen value from candidates;
execute a variable-length-coding-parameter calculating processing in which the circuitry calculates a variable-length coding parameter dependent on an amplitude value from the periodic combined envelope sequence; and
execute a variable-length coding processing in which the circuitry uses the variable-length coding parameter to encode a frequency-domain sequence derived from the input audio signal by variable-length coding dependent on the amplitude value and to output a variable-length code,
wherein the periodic-combined-envelope generating processing obtains, as a periodic combined envelope sequence, a sequence that is obtained by more greatly changing values of samples at integer multiples of a period in the frequency-domain of the input audio signal in the spectral envelope sequence and values of samples whose index is within a predetermined range from any one of the samples at the integer multiples of the period, as the length of the period in the frequency domain of the input audio signal is longer.

2. An encoder comprising:
circuitry configured to:
execute a spectral-envelope-sequence calculating processing in which the circuitry calculates a spectral envelope sequence, $W[1], \ldots, W[N]$, of an input audio signal on the basis of linear prediction of the input audio signal which is a time-domain audio signal in a predetermined time segment;
execute a periodic-combined-envelope generating processing in which the circuitry generates a periodic combined envelope sequence, $W_m, \ldots, W_M[N]$, by changing the spectral envelope sequence, $W[1], \ldots, W[N]$ on the basis of a periodic envelope sequence $P[1], \ldots, P[N]$ which is a periodic component of the input audio signal in the frequency domain, wherein the spectral envelope sequence are changed as in the following formula:

$$W_M[n] = W[n] \cdot (1 + \delta \cdot P[n]),$$

wherein $\delta$ is a predetermined value or a chosen value from candidates, and
execute a variable-length coding processing in which the circuitry encodes a frequency-domain sequence derived from the input audio signal on the assumption that the amplitude value of the frequency-domain sequence is greater for a frequency with a greater value of the periodic combined envelope sequence and outputs a variable-length code,
wherein the periodic-combined-envelope generating processing obtains, as a periodic combined envelope sequence, a sequence that is obtained by more greatly changing values of samples at integer multiples of a period in the frequency-domain of the input audio signal in the spectral envelope sequence and values of samples whose index is within a predetermined range from any one of the samples at the integer multiples of

27 the period, as the length of the period in the frequency domain of the input audio signal is longer.

3. An encoder comprising:
circuitry configured to:
execute a spectral-envelope-sequence calculating processing in which the circuitry calculates a spectral envelope sequence, W[1], ..., W[N], of an input audio signal on the basis of linear prediction of the input audio signal which is a time-domain audio signal in a predetermined time segment;
execute a periodic-combined-envelope generating processing in which the circuitry generates a periodic combined envelope sequence, $W_m[1], \ldots, W_m[N]$, by changing the spectral envelope sequence, W[1], ..., W[N], on the basis of a periodic envelope sequence P[1], ..., P[N] which is a periodic component of the input audio signal in the frequency domain, wherein the spectral envelope sequence are changed as in the following formula:

$$W_M[n]=W[n]\cdot(1+\delta\cdot P[n]),$$

wherein δ is a predetermined value or a chosen value from candidates;
execute a variable-length-coding-parameter calculating processing in which the circuitry calculates a variable-length coding parameter dependent on an amplitude value from the periodic combined envelope sequence; and
execute a variable-length coding processing in which the circuitry uses the variable-length coding parameter to encode a frequency-domain sequence derived from the input audio signal by variable-length coding dependent on the amplitude value and to output a variable-length code,
wherein the periodic-combined-envelope generating processing obtains, as a periodic combined envelope sequence, a sequence that is obtained by more greatly changing values of at least samples at integer multiples of a period in the frequency domain of the input audio signal in the spectral envelope sequence and values of samples whose index is within a predetermined range from any one of the samples at the integer multiples of the period, as a degree of periodicity of the input audio signal is greater.

4. An encoder comprising:
circuitry configured to:
execute a spectral-envelope-sequence calculating processing in which the circuitry calculates a spectral envelope sequence, W[1], ..., W[N], of an input audio signal on the basis of linear prediction of the input audio signal which is a time-domain audio signal in a predetermined time segment; execute a periodic-combined-envelope generating processing in which the circuitry generates a periodic combined envelope sequence, $W_m[1], \ldots, W_m[N]$, by changing the spectral envelope sequence, W[1], ..., W[N], on the basis of a periodic envelope sequence P[1], ..., P[N] which is a periodic component of the input audio signal in the frequency domain, wherein the spectral envelope sequence are changed as in the following formula:

$$W_M[n]=W[n]\cdot(1+\delta\cdot P[n]),$$

wherein δ is a predetermined value or a chosen value from candidates; and
execute a variable-length coding processing in which the circuitry encodes a frequency-domain sequence derived from the input audio signal on the assumption that the amplitude value of the frequency-domain sequence is greater for a frequency with a greater value of the periodic combined envelope sequence and outputs a variable-length code,
wherein the periodic-combined-envelope generating processing obtains, as a periodic combined envelope sequence, a sequence that is obtained by more greatly changing values of samples at integer multiples of a period in the frequency domain of the input audio signal in the spectral envelope sequence and values of samples whose index is within a predetermined range from any one of the samples at the integer multiples of the period, as a degree of periodicity of the input audio signal is greater.

5. A coding method, executing:
calculating a spectral envelope sequence, W[1], ..., W[N], of an input audio signal on the basis of linear prediction of the input audio signal which is a time-domain audio signal in a predetermined time segment;
generating a periodic combined envelope sequence, $W_m[1], \ldots, W_M[N]$, by changing the spectral envelope sequence, W[1], ..., W[N], on the basis of a periodic envelope sequence P[1], ..., P[N] which is a periodic component of the input audio signal in the frequency domain, wherein the spectral envelope sequence are changed as in the following formula:

$$W_M[n]=W[n]\cdot(1+\delta\cdot P[n]),$$

wherein δ is a predetermined value or a chosen value from candidates;
calculating a variable-length coding parameter dependent on an amplitude value from the periodic combined envelope sequence; and
using the variable-length coding parameter to encode a frequency-domain sequence derived from the input audio signal by variable-length coding dependent on the amplitude value and to output a variable-length code,
wherein the periodic combined envelope sequence is obtained by more greatly changing values of samples at integer multiples of a period in the frequency-domain of the input audio signal in the spectral envelope sequence and values of samples whose index is within a predetermined range from any one of the samples at the integer multiples of the period, as the length of the period in the frequency domain of the input audio signal is longer.

6. A non-transitory computer-readable recording medium on which the program for causing a computer to perform the coding method according to claim 5 is recorded.

7. A coding method, executing:
calculating a spectral envelope sequence, W[1], ..., W[N], of an input audio signal on the basis of linear prediction of the input audio signal which is a time-domain audio signal in a predetermined time segment;
generating a periodic combined envelope sequence, $W_M[1], \ldots, W_M[N]$, by changing the spectral envelope sequence, W[1], ..., W[N], on the basis of a periodic envelope sequence P[1], ..., P[N] which is a periodic component of the input audio signal in the frequency domain, wherein the spectral envelope sequence are changed as in the following formula:

$$W_M[n]=W[n]\cdot(1+\delta\cdot P[n]),$$

wherein δ is a predetermined value or a chosen value from candidates; and encoding a frequency-domain sequence derived from the input audio signal on the assumption that the amplitude value of the frequency-domain sequence is greater for a frequency with a greater value of the periodic combined envelope sequence and outputting a variable-length code, wherein the periodic combined envelope sequence is obtained by more greatly changing values of samples at integer multiples of a period in the frequency-domain of the input audio signal in the spectral envelope sequence and values of samples whose index is within a predetermined range from any one of the samples at the integer multiples of the period, as the length of the period in the frequency domain of the input audio signal is longer.

8. A non-transitory computer-readable recording medium on which the program for causing a computer to perform the coding method according to claim 7 is recorded.

9. A coding method, executing:

calculating a spectral envelope sequence, W[1], ..., W[N], of an input audio signal on the basis of linear prediction of the input audio signal which is a time-domain audio signal in a predetermined time segment; and generating a periodic combined envelope sequence, $W_M[1], \ldots, W_M[N]$, by changing the spectral envelope sequence, W[1], ..., W[N], on the basis of a periodic envelope sequence P[1], ..., P[N] which is a periodic component of the input audio signal in the frequency domain, wherein the spectral envelope sequence are changed as in the following formula:

$$W_M[n]=W[n]\cdot(1+\delta\cdot P[n]),$$

wherein δ is a predetermined value or a chosen value from candidates;

calculating a variable-length coding parameter dependent on an amplitude value from the periodic combined envelope sequence; and using the variable-length coding parameter to encode a frequency-domain sequence derived from the input audio signal by variable-length coding dependent on the amplitude value and to output a variable-length code, wherein the periodic combined envelope sequence is obtained by more greatly changing values of samples at integer multiples of a period in the frequency domain of the input audio signal in the spectral envelope sequence and values of samples whose index is within a predetermined range from any one of the samples at the integer multiples of the period, as a degree of periodicity of the input audio signal is greater.

10. A non-transitory computer-readable recording medium on which the program for causing a computer to perform the coding method according to claim 9 is recorded.

11. A coding method executing:

calculating a spectral envelope sequence, W[1], ..., W[N], of an input audio signal on the basis of linear prediction of the input audio signal which is a time-domain audio signal in a predetermined time segment;

generating a periodic combined envelope sequence. $W_M[1], W_M[N]$, by changing the spectral envelope sequence, W[1], ..., W[N], on the basis of a periodic envelope sequence P[1], ..., P[N] which is a periodic component of the input audio signal in the frequency domain, wherein the spectral envelope sequence are charmed as in the following formula:

$$W_M[n]=W[n]\cdot(1+\delta\cdot P[n]),$$

wherein δ is a predetermined value or a chosen value from candidates;

encoding a frequency-domain sequence derived from the input audio signal on the assumption that the amplitude value of the frequency-domain sequence is greater for a frequency with a greater value of the periodic combined envelope sequence and outputting a variable-length code, wherein the periodic combined envelope sequence is obtained by more greatly charming values of samples at integer multiples of a period in the frequency domain of the input audio signal in the spectral envelope sequence and values of samples whose index is within a predetermined range from any one of the samples at the integer multiples of the period, as a degree of periodicity of the input audio signal is greater.

12. A non-transitory computer-readable recording medium on which the program for causing a computer to perform the coding method according to claim 11 is recorded.

* * * * *